United States Patent
Chin

(10) Patent No.: US 9,769,943 B2
(45) Date of Patent: Sep. 19, 2017

(54) CABLE MANAGEMENT DEVICE

(71) Applicant: Peter Chin, Fontana, CA (US)

(72) Inventor: Peter Chin, Fontana, CA (US)

( * ) Notice: Subject to any disclaimer, the term of this patent is extended or adjusted under 35 U.S.C. 154(b) by 0 days.

(21) Appl. No.: 14/748,034

(22) Filed: Jun. 23, 2015

(65) Prior Publication Data

US 2015/0296644 A1    Oct. 15, 2015

Related U.S. Application Data

(63) Continuation-in-part of application No. 14/455,602, filed on Aug. 8, 2014.

(60) Provisional application No. 61/974,398, filed on Apr. 2, 2014, provisional application No. 61/864,137, filed on Aug. 9, 2013.

(51) Int. Cl.
| | |
|---|---|
| H02G 3/04 | (2006.01) |
| H05K 5/02 | (2006.01) |
| B65D 85/08 | (2006.01) |
| A45F 3/02 | (2006.01) |
| B65H 75/36 | (2006.01) |
| H04R 1/10 | (2006.01) |

(52) U.S. Cl.
CPC ............ *H05K 5/0247* (2013.01); *A45F 3/02* (2013.01); *B65D 85/08* (2013.01); *B65H 75/362* (2013.01); *H04R 1/1033* (2013.01); *B65H 2701/3919* (2013.01)

(58) Field of Classification Search
CPC ............... H01B 17/58; B65H 75/362; B65H 2701/3919; H04R 1/1033; H05K 5/02; H05K 5/00; B65D 85/08; B65D 85/00; A45F 3/02; A45F 3/04

USPC ............. 174/72 A, 68.1, 68.3, 135, 136, 69; 248/68.1, 49; 224/245, 902, 604, 191, 224/600

See application file for complete search history.

(56) References Cited

U.S. PATENT DOCUMENTS

| | | | |
|---|---|---|---|
| 2,585,054 A | 2/1952 | Stachura | |
| 2,742,388 A | 4/1956 | Russell | |
| 2,960,561 A | 11/1960 | Plummer | |
| 3,038,558 A * | 6/1962 | Plummer | ............... B65D 59/00 174/136 |
| 3,080,892 A | 3/1963 | Plummer | |
| 3,089,915 A | 5/1963 | Plummer | |
| 3,373,954 A | 3/1968 | Hilsinger | |

(Continued)

OTHER PUBLICATIONS

International Preliminary Report on Patentability for International Application No. PCT/US2014/050400 dated Feb. 9, 2016 in 7 pages.

(Continued)

*Primary Examiner* — Angel R Estrada
(74) *Attorney, Agent, or Firm* — Knobbe Marten Olson & Bear, LLP

(57) ABSTRACT

A cable or cord management device comprises a sheath or enclosure that surrounds the cable or cord that facilitates organization and handling of the cable or cord. The management device can include one or more straps configured to facilitate coupling of the cable management device to a storage container (e.g., a bag or other piece of luggage). The sheath can have an elongate opening closed by a first zipper extending along one side of the sheath and another elongate opening closed by a second zipper extending along the opposite side of the sheath from the first zipper.

16 Claims, 22 Drawing Sheets

(56) References Cited

U.S. PATENT DOCUMENTS

| | | | | |
|---|---|---|---|---|
| 3,624,800 | A | 11/1971 | Swick | |
| 3,796,304 | A | 3/1974 | Blais | |
| 4,422,478 | A | 12/1983 | Pentney et al. | |
| 4,478,661 | A | 10/1984 | Lewis | |
| 4,580,767 | A | 4/1986 | Zimmerman | |
| D296,322 | S | 6/1988 | Collins | |
| 4,939,778 | A | 7/1990 | Tomberlin | |
| 4,987,724 | A | 1/1991 | Rutherford | |
| 5,211,321 | A * | 5/1993 | Rodriguez | A45F 5/00 224/604 |
| 5,220,269 | A * | 6/1993 | Chen | H02J 7/0042 224/902 |
| 5,391,838 | A | 2/1995 | Plummer, III | |
| 5,397,243 | A | 3/1995 | MacMurdo | |
| 5,439,109 | A * | 8/1995 | McBride | B65H 75/362 174/135 |
| 5,535,787 | A | 7/1996 | Howell | |
| D376,786 | S | 12/1996 | Binzel | |
| 5,600,098 | A | 2/1997 | Kazaks | |
| 5,651,161 | A | 7/1997 | Asta | |
| 5,861,579 | A | 1/1999 | Bickersteth et al. | |
| D406,428 | S | 3/1999 | Pyle | |
| D408,365 | S | 4/1999 | Sanders | |
| 5,901,756 | A | 5/1999 | Goodrich | |
| 5,905,231 | A | 5/1999 | Houte et al. | |
| 5,910,643 | A | 6/1999 | Laine et al. | |
| 5,949,026 | A | 9/1999 | DeFlorio | |
| 6,233,345 | B1 | 5/2001 | Urwyler | |
| D445,093 | S | 7/2001 | Staskey | |
| 6,301,752 | B1 | 10/2001 | Koppang | |
| D460,741 | S | 7/2002 | Nakamura | |
| 6,443,347 | B1 * | 9/2002 | Elizalde | A45F 3/14 224/245 |
| 6,453,950 | B1 | 9/2002 | Smith | |
| 6,523,584 | B1 | 2/2003 | Rehrig | |
| 6,571,833 | B1 | 6/2003 | McLarty et al. | |
| 6,809,266 | B1 | 10/2004 | Hoi et al. | |
| 6,878,882 | B2 | 4/2005 | Larkin | |
| 6,883,693 | B2 * | 4/2005 | Han | A45C 13/36 224/245 |
| 6,886,601 | B2 | 5/2005 | Allen | |
| 6,993,237 | B2 | 1/2006 | Cooke et al. | |
| 7,433,571 | B2 | 10/2008 | Kendricks | |
| 7,438,964 | B2 | 10/2008 | Clark | |
| 7,447,414 | B1 | 11/2008 | Camick | |
| 7,484,539 | B1 | 2/2009 | Huang | |
| 7,550,669 | B2 | 6/2009 | Rizzuto, Jr. | |
| 7,622,670 | B1 * | 11/2009 | Sanderson | H02G 3/0481 174/36 |
| 7,807,928 | B1 * | 10/2010 | Tate | H02G 3/0487 174/110 R |
| 8,276,882 | B2 | 10/2012 | Jockisch | |
| 8,383,941 | B2 | 2/2013 | Goodman | |
| 8,420,942 | B2 | 4/2013 | Short | |
| 8,455,758 | B2 | 6/2013 | Groset et al. | |
| 8,546,694 | B1 | 10/2013 | Harrison | |
| D693,773 | S | 11/2013 | Chen | |
| 8,785,778 | B2 * | 7/2014 | Streeter | A45F 5/00 174/72 A |
| 9,281,669 | B2 * | 3/2016 | Kennedy | H02G 3/0462 |
| 2001/0010727 | A1 | 8/2001 | Urwyler | |
| 2003/0024850 | A1 | 2/2003 | Synder | |
| 2003/0142933 | A1 | 7/2003 | Morris | |
| 2005/0230143 | A1 | 10/2005 | Simmons | |
| 2006/0185873 | A1 | 8/2006 | Johnson | |
| 2007/0151750 | A1 | 7/2007 | Dean | |
| 2009/0056975 | A1 | 3/2009 | Lin | |
| 2009/0314515 | A1 | 12/2009 | Bevirt et al. | |
| 2010/0096184 | A1 | 4/2010 | Ambo et al. | |
| 2011/0056721 | A1 | 3/2011 | Goodman | |
| 2011/0290532 | A1 | 12/2011 | Cano, Jr. | |
| 2012/0241195 | A1 | 9/2012 | Doll | |
| 2012/0305288 | A1 | 12/2012 | Scifo et al. | |
| 2012/0308184 | A1 | 12/2012 | Pina et al. | |
| 2014/0116747 | A1 | 5/2014 | Chamberlain et al. | |
| 2014/0220846 | A1 | 8/2014 | Woodruff et al. | |
| 2014/0360771 | A1 | 12/2014 | Itani et al. | |
| 2015/0027778 | A1 | 1/2015 | Murao et al. | |
| 2015/0041173 | A1 | 2/2015 | Chin | |

OTHER PUBLICATIONS

International Search Report for International Application No. PCT/US2014/050400 dated Nov. 26, 2014 in 13 pages.

\* cited by examiner

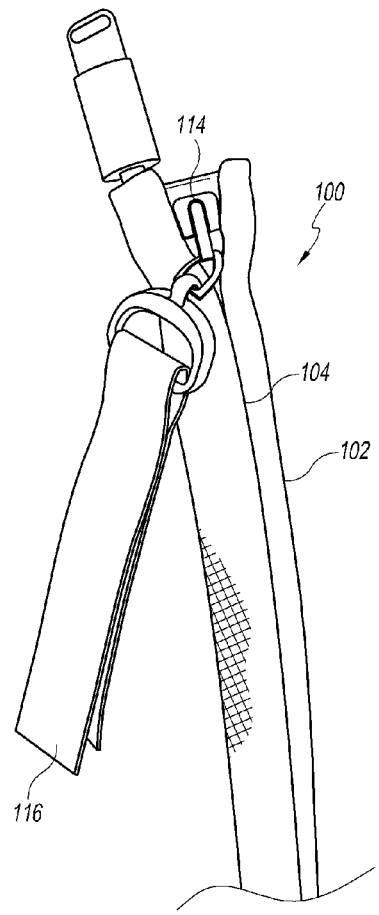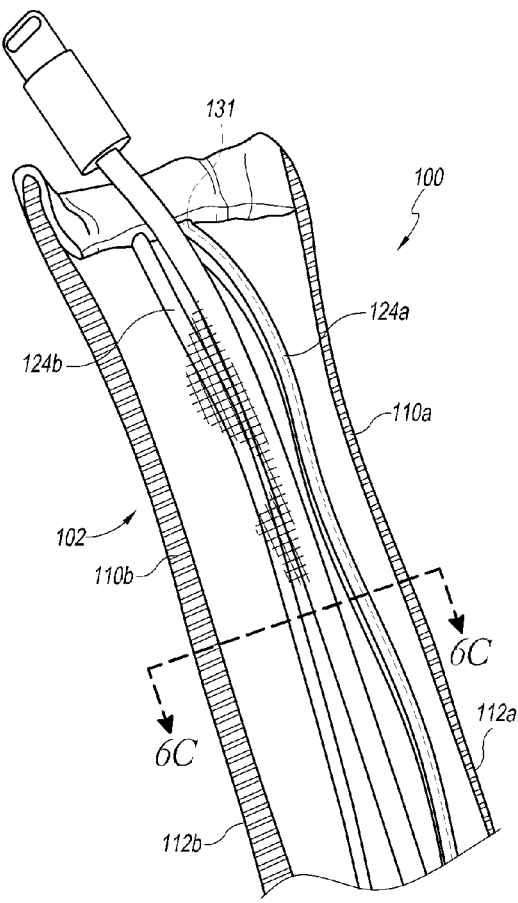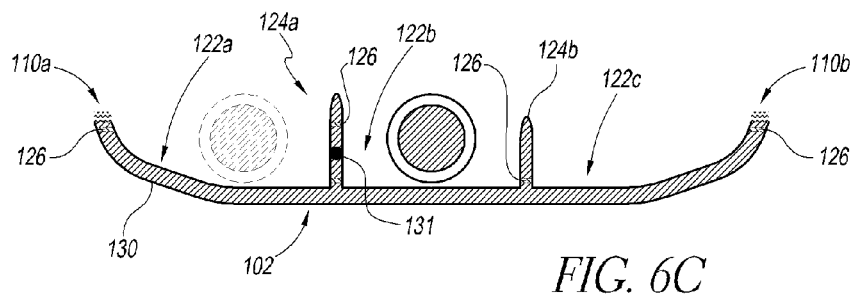
FIG. 6A
FIG. 6B
FIG. 6C

CABLE MANAGEMENT DEVICE

PRIOR APPLICATIONS

This application is a continuation-in-part of U.S. patent application Ser. No. 14/455,602 filed Aug. 8, 2014 and entitled Cable Management Device, which claims the benefit of U.S. Provisional Application No. 61/864,137 filed Aug. 9, 2013 entitled Cable Management Device and U.S. Provisional Application No. 61/974,398 filed Apr. 2, 2014 entitled Cable Management Device, each of which are hereby incorporated by reference in their entireties.

TECHNICAL FIELD

The present technology relates to electrical cables and, in particular, cable management devices.

DESCRIPTION OF THE RELATED TECHNOLOGY

Electronic devices often utilize electronic cables to transmit various electrical currents and signals from one electronic device to another electronic device. Cables can include, for example, audio cables, which may include for example headphones, as illustrated in FIG. 1, video cables, power cables, etc. Cables can be used in conjunction with multimedia devices, mp3 players, cellular telephones, laptop computers, home entertainments systems, and the like.

SUMMARY

The systems, methods and devices described herein have innovative aspects, no single one of which is indispensable or solely responsible for their desirable attributes. Without limiting the scope of the claims, some of the advantageous features will now be summarized.

One aspect of the present invention is the realization that cables utilized in conjunction with electronic devices, particularly portably electronic devices, can often become tangled or damaged. In addition, due to their finite length, cables can be too long for the intended application. Thus, there exists a need for a cable management device as described herein.

One non-limiting embodiment of the present invention includes a cable management device comprising an elongate sheath configured to receive an electrical cable; wherein the sheath comprises a flexible material configured to prevent the electrical cable from becoming tangled; a wire coupled to the sheath, the wire disposed along a substantial portion of the length of the sheath; wherein the wire is configured to resist bending of the cable management device; and wherein the wire is configured to maintain the shape of the cable management device.

According to another embodiment, the wire is disposed within the sheath.

According to another embodiment, the wire comprises a diameter between approximately 0.01 inch and 0.06 inch.

According to another embodiment, the wire comprises a metal material.

According to another embodiment, the wire comprises stainless steel.

According to another embodiment, the sheath comprises a tube like structure.

According to another embodiment, the sheath is configured to receive the cable via sliding the cable through a first end of the sheath and along the length of the sheath until a portion of the cable exits a second end of the sheath, wherein the second end is opposite the first end.

According to another embodiment, at least one of the ends of the sheath and the opposite end of the sheath is configured to be at least partially sealed once the cable has been installed in the sheath such that the cable is limited from sliding out of the sheath.

According to another embodiment, the sheath comprises an open side along the elongate length of the sheath, wherein the open side is configured to be sealed once the cable has been installed in to the sheath.

According to another embodiment, the open side of the sheath is temporarily sealable such that the cable can later be removed.

According to another embodiment, a method of managing a cable device comprises: installing a cable within a cable management device; wherein installing a cable within a cable management device comprises sliding the cable through an elongate tube-like flexible structure; wherein the cable management device comprises a form retaining element configured to maintain the shape of the cable management device; connecting the cable to an electrical device; manipulating the cable management device to a preferred length; wherein manipulating the cable management device to a preferred length comprises bending the cable management device and effectively bringing each end of the cable closer together.

According to another embodiment, a cable management device comprising: a sheath having a first and a second end that is sized to receive at least one cable and that has an opening at the first and the second end such that end pieces of the cable extend out beyond the first and the second end; and a bendable stiffening element that is positioned within the sheath to permit the sheath to retain a desired shape.

In another embodiment, the sheath comprises a cylindrical sheath that has an opening at a first and a second end such that end pieces of the cable extend out beyond the first and the second end.

In another embodiment, the sheath defines side walls and wherein openings are formed in the side walls to permit an end of the at least one cable to extend outward form the sheath via the openings in the side walls.

In another embodiment, the openings in the side walls are spaced along the length of the sheath.

In another embodiment, the device further comprising at least one retaining member that are positioned adjacent an inner wall of the sheath adjacent at least one of the openings in the sidewall, wherein the retaining members retain the cord in a first configuration by securing a portion of the cord between the retaining member and the inner wall of the sheath.

In another embodiment, the inner wall of the sheath defines a cylindrical shape and the at least one retaining member comprises a plurality of ring shaped retaining members that are arranged to as to extend about the inner circumference of the cylindrical inner wall of the sheath.

In another embodiment, the sheath has a first cross-sectional area along its length and wherein at least one of the openings at the first or second end has a second cross-sectional area greater than the first cross-sectional area.

In another embodiment, a slit is formed that extends from the first end partially along the length of the sheath so as to define a portion of the sheath with the second cross-sectional area.

In another embodiment a closing device is formed on the slit so as to permit the portion of the sheath adjacent the slit to have either the first or second cross-sectional area.

In another embodiment, the closing device comprises a zipper.

In another embodiment, a closing device extends substantially along the length of the sheath so as to permit the sheath to be opened to receive cords.

In another embodiment, the zipper extends from the first end to the second end of the sheath.

In another embodiment, the bendable stiffening member comprises a wire having a rigidity selected so that when the device is bent into a first configuration, the wire substantially maintains the device in the first configuration.

In another embodiment, the device further comprising an unreinforced sheath that is attached to the first end of the sheath, wherein the unreinforced sheath comprises a flexible sheath that is movable along the length of a cord.

In another embodiment, the unreinforced sheath is formed of a softer material than the material forming the sheath.

In another embodiment, the sheath defines an inner surface that is comprised of a plurality of tabs that extend along the length of the sheath so as to define channels that receive the at least one cord.

In another embodiment, the reinforcing member is positioned within one of the tabs so as to be spaced away from the sheath.

In another embodiment, the inner surface is formed by three parallel pieces of fabric that are sewn together to define two tabs.

In another embodiment, at least one of the openings at the first or second end of the sheath has a cover.

In another embodiment, at least one of the first or second ends is flared.

In another embodiment, the device further comprising at least one retaining member that are positioned adjacent an inner wall of the sheath wherein the retaining members retain the cord in a first configuration by securing a portion of the cord between the retaining member and the inner wall of the sheath.

In another embodiment, the inner wall of the sheath defines a cylindrical shape and the at least one retaining member comprises a plurality of ring shaped retaining members that are arranged to as to extend about the inner circumference of the cylindrical inner wall of the sheath.

According to another embodiment a method of organizing cords, the method comprising: positioning at least one cord within a sheath having a stiffening member so that the ends of the cords having at least one end piece extend out of the sheath; bending the cord within the sheath so that a loop is formed inside of the sheath to reduce the amount of excess cord outside of the sheath; and bending the sheath into a desired orientation and length.

In another embodiment, the method further comprising securing the at least one cord within the sheath.

In another embodiment, securing the at least one cord within the sheath comprises securing the bent portion within the sheath.

In another embodiment, securing the at least one cord within the sheath comprises positioning a portion of the at least one cord between a retainer and an inner wall of the sheath.

In another embodiment, the end piece extends out of an opening in the side wall of the sheath.

In another embodiment, the end piece extends out of an opening in the end of the sheath.

In another embodiment, inserting at least one cord in the sheath comprises inserting an end piece through a flared opening at one end of the sheath.

In another embodiment, further comprising opening the sheath with a zipper so as to expose the interior of the sheath and pulling the cord and end piece through.

According to certain embodiments, a cable management device comprises a sleeve portion having a first end, a second end, a hollow interior, and a sleeve length between the first and second ends of the sleeve portion. The cable management device can include a first strap having a first end and a second end, the first end connected to the first end of the sleeve portion. In some embodiments the cable management device includes a second strap having a first end and a second end, the first end connected to the second end of the sleeve portion. In some cases, the device includes a first attachment member connected to the second end of the first strap, the first attachment member configured to connect with a structure on a storage container. In some cases, the device includes a second attachment member connected to the second end of the second strap, the second attachment member configured to connect with a structure on a storage container.

In another embodiment, the sleeve portion comprises: a first sleeve section extending along at least a portion of the sleeve length; and a second sleeve section extending along at least a portion of the sleeve length, the second sleeve section connected to the first sleeve section, wherein the hollow interior of the sleeve portion is between the first sleeve section and the second sleeve section.

In another embodiment, the first sleeve section is connected to the second sleeve section via a first zipper along at least a portion of the sleeve length.

In another embodiment, the first sleeve section is connected to the second sleeve section via a second zipper along at least a portion of the sleeve length.

In another embodiment, the first zipper unzips toward the first end of the sleeve portion with respect to the second end of the sleeve portion, and wherein the second zipper unzips toward the second end of the sleeve portion with respect to the first end of the sleeve portion.

In another embodiment, the sleeve portion comprises an inner surface and a plurality of cable retainers connected to the inner surface of the sleeve portion along the sleeve portion length, each of the cable retainers comprising a flexible loop configured to retain a portion of a cable against the inner surface of the sleeve portion when the portion of cable is inserted through the respective cable retainer.

In another embodiment, the sleeve portion comprises an inner surface and a first pair of mating features connected to the inner surface of the sleeve portion at or near the first end of the sleeve portion, the first pair of mating features configured to releasably connect two portions of the inner surface of the sleeve portion to each other.

In another embodiment, the sleeve portion comprises a second pair of mating features connected to the inner surface of the sleeve portion at or near the second end of the sleeve portion, the second pair of mating features configured to releasably connect two portions of the inner surface of the sleeve portion to each other.

In another embodiment, each of the first and second attachment members are clips.

In another embodiment, the sleeve portion comprises a first side extending between first and second ends of the sleeve portion and a second side opposite the first side and extending between the first and second ends of the sleeve portion, and wherein the first strap is connected to the first side of the sleeve portion and the second strap is connected to the second side of the sleeve portion.

In another embodiment, the first strap has an adjustable length.

In another embodiment, wherein the second strap has an adjustable length.

According to some variants, a portable storage container comprises: one or more walls defining a storage space; a first connection member connected to one or more of the one or more walls; a second connection member connected to one or more of the one or more walls; and a cable management device. The cable management device can comprise a sleeve portion having a first end, a second end, a hollow interior, and a sleeve length between the first and second ends of the sleeve portion; a first strap having a first end and a second end, the first end connected to the first end of the sleeve portion; a second strap having a first end and a second end, the first end connected to the second end of the sleeve portion; a first attachment member connected to the second end of the first strap, the first attachment member configured to connect with a structure on a storage container; a second attachment member connected to the second end of the second strap, the second attachment member configured to connect with a structure on a storage container.

In another embodiment, the sleeve portion comprises: a first sleeve section extending along at least a portion of the sleeve length; and a second sleeve section extending along at least a portion of the sleeve length, the second sleeve section connected to the first sleeve section, wherein the hollow interior of the sleeve portion is between the first sleeve section and the second sleeve section.

In another embodiment, the first sleeve section is connected to the second sleeve section via a first zipper along at least a portion of the sleeve length.

In another embodiment, the first sleeve section is connected to the second sleeve section via a second zipper along at least a portion of the sleeve length.

In another embodiment, the first zipper unzips toward the first end of the sleeve portion with respect to the second end of the sleeve portion, and wherein the second zipper unzips toward the second end of the sleeve portion with respect to the first end of the sleeve portion.

In another embodiment, the sleeve portion comprises an inner surface and a plurality of cable retainers connected to the inner surface of the sleeve portion along the sleeve portion length, each of the cable retainers comprising a flexible loop configured to retain a portion of a cable against the inner surface of the sleeve portion when the portion of cable is inserted through the respective cable retainer.

In another embodiment, the sleeve portion comprises an inner surface and a first pair of mating features connected to the inner surface of the sleeve portion at or near the first end of the sleeve portion, the first pair of mating features configured to releasably connect two portions of the inner surface of the sleeve portion to each other.

In another embodiment, the sleeve portion comprises a second pair of mating features connected to the inner surface of the sleeve portion at or near the second end of the sleeve portion, the second pair of mating features configured to releasably connect two portions of the inner surface of the sleeve portion to each other.

In another embodiment, each of the first and second attachment members are clips.

In another embodiment, the sleeve portion comprises a first side extending between first and second ends of the sleeve portion and a second side opposite the first side and extending between the first and second ends of the sleeve portion, and wherein the first strap is connected to the first side of the sleeve portion and the second strap is connected to the second side of the sleeve portion.

In another embodiment, the first strap has an adjustable length.

In another embodiment, the second strap has an adjustable length.

According to some embodiments, a cable management device comprises a first sleeve section having a first end, a second end, a first edge extending between the first end and the second end, and a second edge extending between the first end and the second end. In some embodiments, the device includes a second sleeve section having a first end, a second end, a first edge extending between the first end and the second end, and a second edge extending between the first end and the second end. In some configurations, the device includes a first strap having a first end and a second end, the first end of the first strap connected to the first end of the first sleeve section. In some embodiments, the device includes a second strap having a first end and a second end, the first end of the first strap connected to the second end of the second sleeve section. In some cases, at least a portion of the first edge of the first sleeve section is connected to at least a portion of the first edge of the second sleeve section via a first zipper. In some embodiments, at least a portion of the second edge of the first sleeve section is connected to at least a portion of the second edge of the second sleeve section via a second zipper.

In another embodiment, the first zipper unzips in a direction toward the second end of the first sleeve section with respect to the first end of the first sleeve section, and wherein the second zipper unzips in a direction toward the first end of the first sleeve section with respect to the second end of the first sleeve section.

In another embodiment, the first zipper is configured to remain connected to both the first and second sleeve sections when the first zipper is fully unzipped.

In another embodiment, the second zipper is configured to remain connected to both the first and second sleeve section when the first zipper is fully unzipped.

In another embodiment, the second strap has an adjustable length.

In another embodiment, the second strap is longer than the first strap.

In another embodiment, the first strap is connected to the first sleeve section via sewing.

A method of managing a set of headphones can include selecting a cable management device. The cable management device can include: a sleeve portion having a hollowing interior configured to receive a cable portion of the headphones; a first strap attached to one end of the sleeve portion; and/or a second strap attached to another end of the sleeve portion. The method can include inserting the cable portion of the headphones through the sleeve portion of the cable management device. In some embodiments, the method includes attaching an attachment member of the first strap to a first portion of a storage container. In some cases, the method includes attaching an attachment member of the second strap to a second portion of the storage container.

According to some embodiments, a carrying bag can include one or more walls defining a storage space. In some embodiments, the carrying bag includes a shoulder strap connected to the one or more walls. Said shoulder strap can include two flexible elongate panels joined together to define an elongate compartment configured for storing headphone cables. In some embodiments, access openings are formed along an upper and a lower border of the flexible elongate panels to allow end portions of headphone cables to extend outwardly from the compartment. In some cases, opposing closable openings are formed along the lateral borders of the flexible elongate panels to facilitate storage and access of the headphone cables.

In another embodiment, the elongate compartment comprises an inner surface. In another embodiment, one or more elastic bands are connected to the inner surface to maintain a portion of the headphone cables against the inner surface when the portion of the headphone cables is inserted through the one or more elastic bands.

In another embodiment, the opposing closable openings are openable and closeable via use of zippers.

In another embodiment, one closable opening is openable via a first zipper that is configured to unzip in a first direction and another closeable opening is openable via a second zipper that is configured to unzip in a second direction opposite the first direction.

BRIEF DESCRIPTION OF THE DRAWINGS

The above-mentioned aspects, as well as other features, aspects, and advantages of the present technology will now be described in connection with various embodiments, with reference to the accompanying drawings. The illustrated embodiments, however, are merely examples and are not intended to be limiting. Like reference numbers and designations in the various drawings indicate like elements.

FIGS. 6A-6C are partial perspective views and a cross-sectional view of another embodiment of a cable management device.

DETAILED DESCRIPTION

Figure 1:
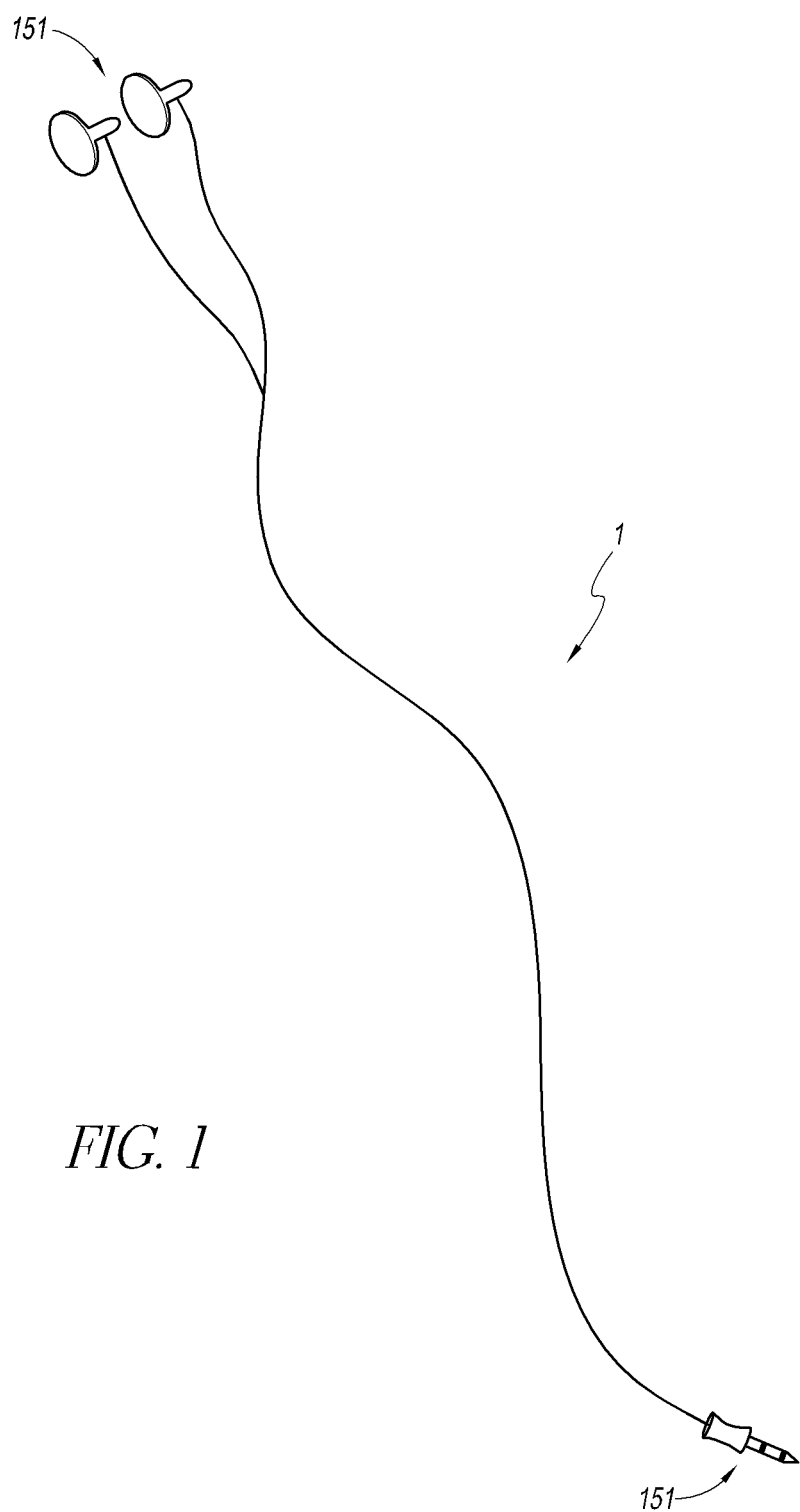
FIG. 1 illustrates a cable.

In the following detailed description, reference is made to the accompanying drawings, which form a part of the present disclosure. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and form part of this disclosure. For example, a system or device may be implemented or a method may be practiced using any number of the aspects set forth herein. In addition, such a system or device may be implemented or such a method may be practiced using other structure, functionality, or structure and functionality in addition to or other than one or more of the aspects set forth herein. Alterations and further modifications of the inventive features illustrated herein, and additional applications of the principles of the inventions as illustrated herein, which would occur to one skilled in the relevant art and having possession of this disclosure, are to be considered within the scope of the invention.

Descriptions of unnecessary parts or elements may be omitted for clarity and conciseness, and like reference numerals refer to like elements throughout. In the drawings, the size and thickness of layers and regions may be exaggerated for clarity and convenience.

Features of the present disclosure will become more fully apparent from the following description and appended claims, taken in conjunction with the accompanying drawings. It will be understood these drawings depict only certain embodiments in accordance with the disclosure and, therefore, are not to be considered limiting of its scope; the disclosure will be described with additional specificity and detail through use of the accompanying drawings. An apparatus, system or method according to some of the described embodiments can have several aspects, no single one of which necessarily is solely responsible for the desirable attributes of the apparatus, system or method. After considering this discussion, and particularly after reading the section entitled "Detailed Description" one will understand how illustrated features serve to explain certain principles of the present disclosure.

Figure 2:
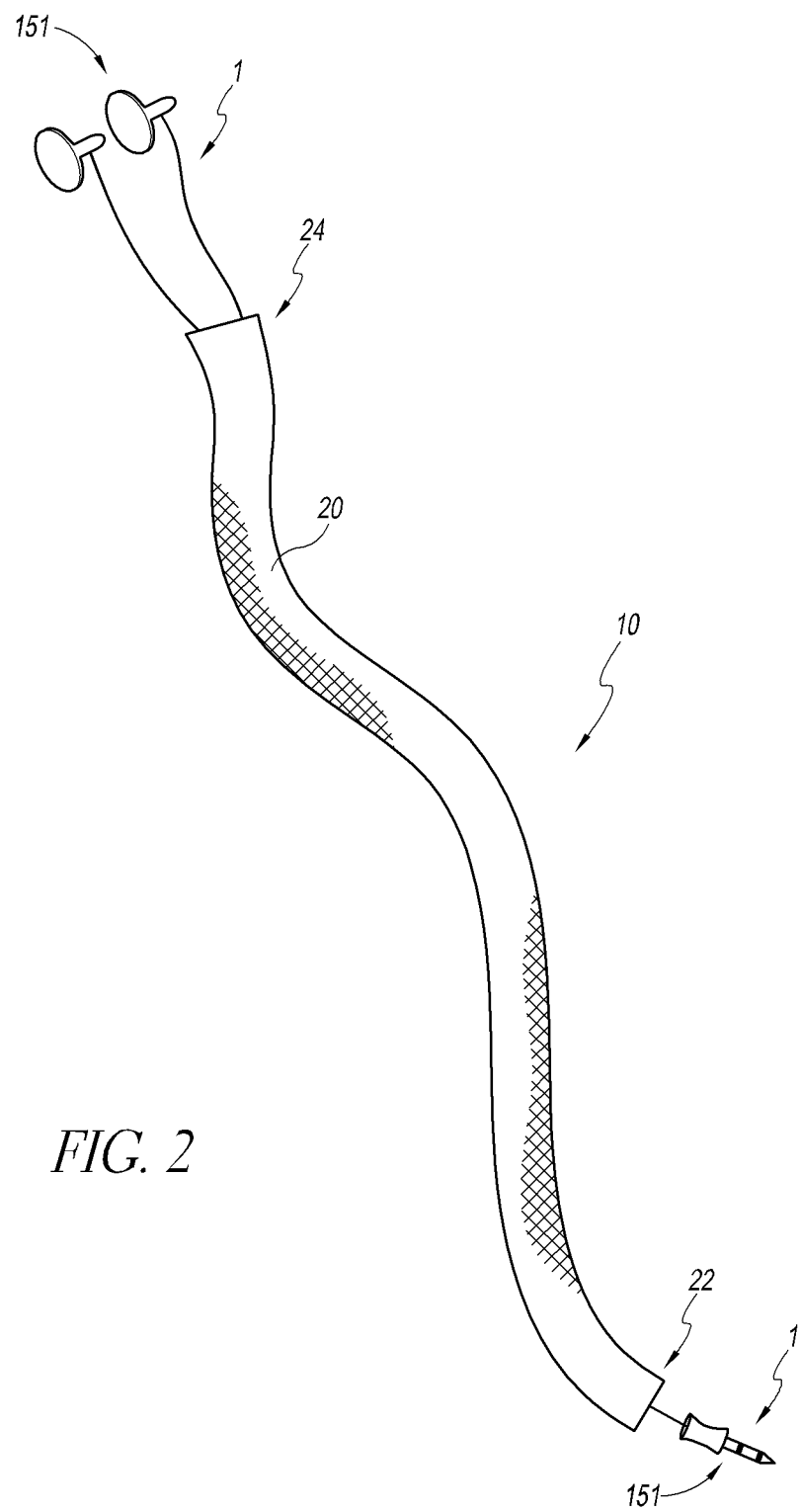
FIG. 2 illustrates one embodiment a cable management device coupled to a cable.

Embodiments described herein generally relate to systems, devices, and methods related to electronic cables. More specifically, some embodiments relate to cable management devices. FIG. 1 illustrates a cable 1, and more specifically a headphone cable. A headphone cable is one type of cable 1 which can be coupled with the cable management device 10. Other types of cables can also be used without departing from the spirit and scope of the present invention. FIG. 2 illustrates one embodiment of a cable management device 10 coupled to a cable 1. In some embodiments, the cable management device 10 can be configured to couple to a cable 1. The cable management device 10 can surround at least a portion of the cable 1. In some embodiments, the cable management device 10 can provide a layer of protection around the cable 1. In some embodiments, the cable management device 10 can be configured to shield the cable 1 from interference. In some embodiments, the cable management device 10 can prevent tangling of the cable 1. The cable management device 10 can include a sheath 20. In some embodiments, the sheath 20 can form an elongate enclosure surrounding at least a portion of a cable 1. The sheath 20 can form an elongate tube-like structure. In some embodiments, the cable 1 can be fed through the sheath 20 such that at least a portion of the cable 1 is installed within the sheath 20. In some embodiments, the sheath 20 is configured to receive the cable 1 via sliding the cable 1 into a first end 22 of the sheath 20 and along the length of the sheath 20 until a portion of the cable 1 exits a second end 24 of the sheath 20. The second end 24 can be opposite the first end 22. In some embodiments, at least one end of the sheath 20 can be at least partially sealed once the cable 1 has been installed to limit the cable 1 from sliding out of the sheath 20.

In some embodiments, the sheath 20 can include apertures configured to provide access to intermediate portions of a cable 1 which may contain features such as buttons or controls. In other embodiments, the sheath 20 may not form a tube-like structure and the cable 1 can be coupled to a portion of the sheath 20 such that the cable 1 is not surrounded by the sheath 20. The sheath 20 can comprise a material which is configured to bend and flex as the cable 1 bends and flexes. The sheath 20 can be manufactured from a variety of materials which may include, for example, polypropylene, nylon, polyester, woven fabric, unwoven fabric, paper, etc. As is also shown in FIG. 1, the cable 1 includes end pieces 151 that can comprise plugs, ear phones, speakers etc. It will also be appreciated that the end pieces 151 can have a cross-section that is wider than the cross-section of the sheath 20 which can complicate installation of the cord 1 within the sheath 20. This issue will be discussed in greater detail below.

Figure 3:
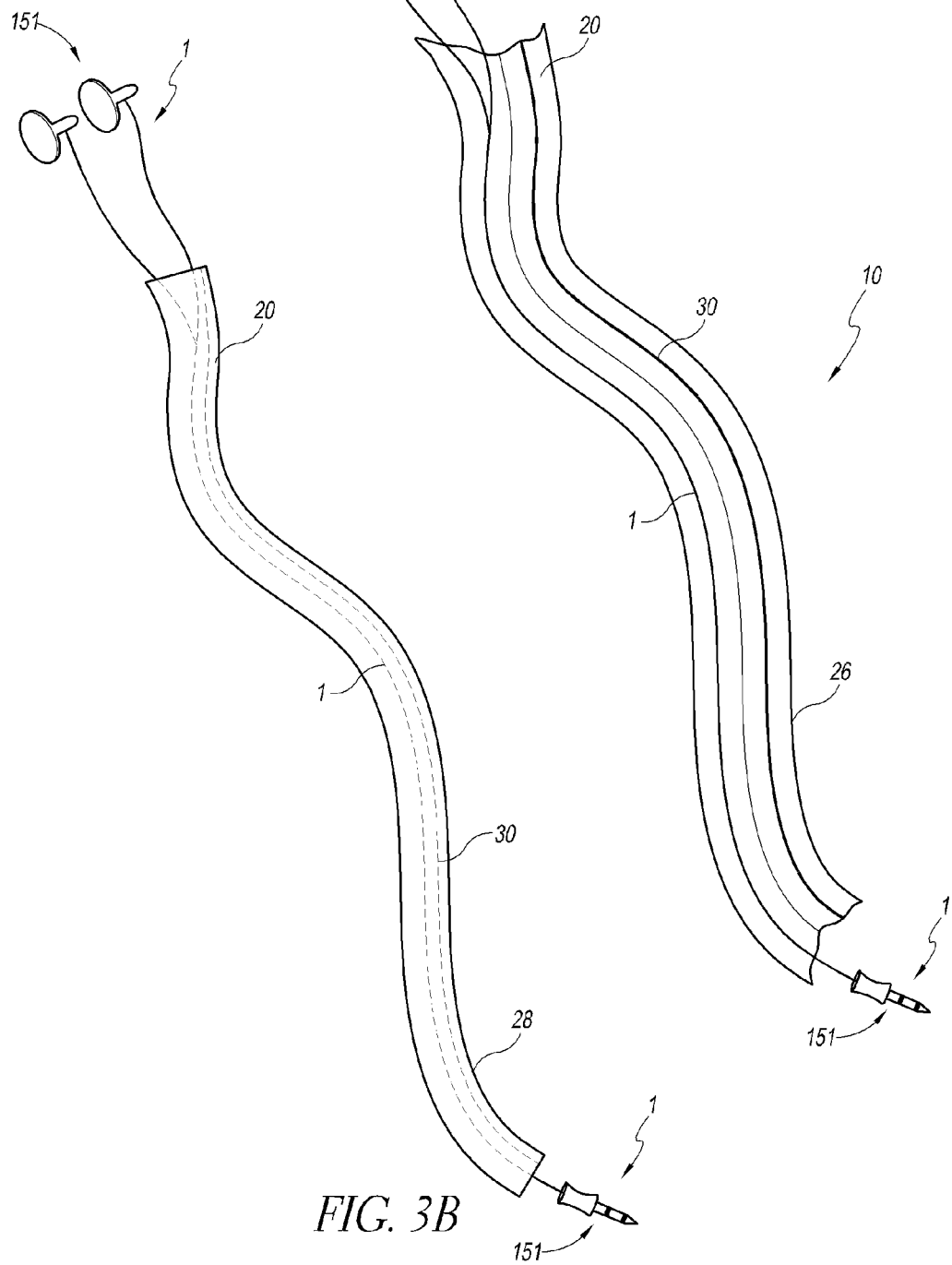
FIG. 3A illustrates one embodiment of a cable management device in an open position.
FIG. 3B illustrates the cable management device of FIG. 3A in a sealed position.

FIG. 3A illustrates one embodiment of a sheath 20 in an open position. FIG. 3B illustrates the sheath 20 of FIG. 3A in a sealed position. In some embodiments, the sheath 20 can be open along a side 26, as illustrated in FIG. 3A. The sheath 20 can be configured to be closed once the cable 1 has been installed in the sheath 20, as illustrated in FIG. 3B. In some embodiments, a sealed seam 28 can be disposed along the side of the sheath 20. In some embodiments, the sheath 20 can be configured to be permanently sealed. Permanently sealing the sheath 20 may include, for example, stitching, adhesives, heat pressing, etc. In some embodiments, the sheath 20 can be configured to be temporarily sealed. Temporarily sealing the sheath 20 may include, for example, hook and loop fastening, zippers, adhesive, buttons, snaps, etc. In some embodiments, the sheath 20 can comprise a material configured to stick to itself, such that the sheath 20 can be wrapped around the cable 1 and at least a portion of itself, thus sealing itself and retaining the cable 1 inside the sheath 20. In some embodiments, the cable management device 10 can be configured to fit a variety of cables 1. In some embodiments, the cable management device 10 can be configured to include a plurality of cables 1. In some embodiments, the cable management device 10 can be configured to temporarily receive a cable 1. In other embodiments, the cable management device 10 can be configured to permanently receive a cable 1. In other embodiments, the cable management device 10 can include a cable 1.

In some embodiments, the cable management device 10 can include a form retaining element or stiffening member, such as a wire 30 as illustrated in FIGS. 3A and 3B. In some embodiments, the wire 30 can be disposed within the sheath 20. In other embodiments, the wire 30 can be disposed within a pocket formed in the cable management device 10. In other embodiments, the wire 30 can be located on the exterior of the cable management device 10. In some embodiments, the wire 30 can be disposed along the length of the elongate cable management device 10. In some embodiments, the wire 30 can be disposed along a substantial portion of the length of the cable management device 10. In some embodiments, the wire 30 can be affixed to the sheath 20. The wire 30 can resist bending of the cable management device 10. In some embodiments, the wire 30 is configured to resist bending of the cable management device 10. In some embodiments, the wire 30 wire 30 is configured to maintain the shape of the cable management device 10. In some embodiments, the wire 30 can comprise a metal material such that when the wire 30 is bent, it tends to remain in the bent configuration. In some embodiments, the wire 30 can comprise stainless steel. Stainless steel is a corrosion resistant material. Also, stainless steel is a strong yet flexible and resilient material which can withstand repeated bending of the cable management device 10 without failing. The form retention qualities of the wire 30 can allow a user to manipulate the cable management device 10, along with the cable 1, in nearly any desirable configuration.

Figure 4:
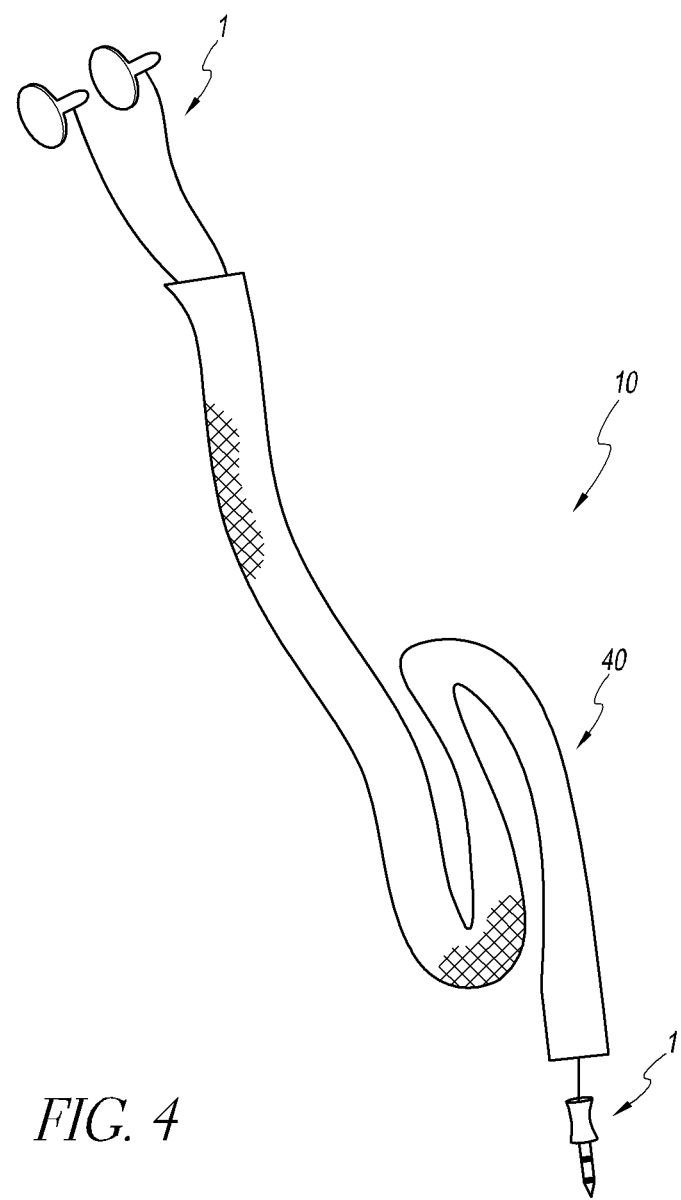
FIG. 4 illustrates one embodiment of a cable management device which has been manipulated into a bent configuration.
Figure 5:
FIG. 5 illustrates one embodiment of a cable management device wrapped around a wrist.

FIG. 4 illustrates one embodiment of a cable management device 10 which has been manipulated into a bent configuration. The wire 30 allows the cable management device 10 to be wrapped or bent to include a bend 40 such that the effective length of the cable management device 10, and the cable 1, is shortened to a desirable length, as illustrated in FIG. 4. FIG. 5 illustrates one embodiment of a cable management device 10 wrapped around a wrist 50. In some embodiments, the cable management device 10 can be wrapped around various animate or inanimate objects, which may include for example, a wrist of 50 a person utilizing the cable 1.

In some embodiments, the cable management device 10 can be configured to couple to a particular type of cable 1. The stiffness and form retaining qualities of a wire 30 can depend on the diameter of the wire 30. In some embodiments, a cable management device 10 configured for a smaller diameter or more flexible cable 1 can include a wire 30 of a smaller diameter. In some embodiments, a cable management device 10 configured for a larger diameter or less flexible wire 30 can include a wire 30 of a larger diameter. In some embodiments, the wire 30 can comprise stainless steel hanging wire 30. In some embodiments, a cable management device 10 can include a wire 30 between approximately 0.01 inch and 0.060 inch in diameter. In some embodiments, a cable management device 10 can include a wire 30 between approximately 0.02 inch and 0.05 inch in diameter. In some embodiments, a cable management device 10 can include a wire 30 between approximately 0.03 inch and 0.04 inch in diameter. In some embodiments, a cable management device 10 configured to couple to a thinner cable 1, such as a headphone cable, can include a wire 30 between approximately 0.02 inch and 0.035 inch in diameter. In some embodiments, a cable management device 10 configured to couple to a medium size cable 1, such as a charging cable for a cellular telephone, can include a wire 30 between approximately 0.03 inch and 0.04 inch in diameter. In some embodiments, a cable management device 10 configured to couple to a larger size cable 1, such as for a laptop computer, can include a wire 30 between approximately 0.035 inch and 0.055 inch in diameter. In other embodiments, other thickness wires 30 can be included in the cable management device 10 depending on the thickness and flexibility of the intended cable 1.

In other embodiments, the cable management device 10 can be configured to retain its configuration without the aid of a wire 30. In some embodiments, the form retaining element can be included in the sheath 20. In some embodiments, the sheath 20 can be configured to retain its configuration. In some embodiments, the sheath 20 can comprise a material which tends to remain in its present configuration. In other embodiments, the sheath 20 can be configured to temporarily couple to another portion of the sheath 20, such that when the sheath 20 is bent or wrapped into a configuration wherein the sheath 20 touches another portion of the sheath 20, the portions are temporarily coupled together, retaining the configuration of the cable management device 10. In some embodiments, the sheath 20 material can be configured to stick to itself. In other embodiments, the sheath 20 can include hook and loop closures such that the sheath 20 can stick to another portion of the sheath 20. In some embodiments, the sheath 20 can include an adhesive that only sticks to another portion of the sheath 20 material. In some embodiments, the sheath 20 can include an adhesive that only sticks to another portion of the sheath 20 which also incorporates the adhesive.

In some embodiments, the sheath 20 can comprise one or more colors. In some embodiments, lettering, images, and/or logos can be included on the sheath 20. In some embodiments, various methods, which may include for example, screen printing, sublimation, embroidery, etc., can be utilized to add lettering, images, and/or logos to the sheath 20.

FIGS. 6A-6E illustrate another embodiment of a cable management device 100 of the instant application. As shown, the device 100 includes a sheath 102 that is preferably closed along the length of the device via a sealing mechanism 104 such as a zipper. The zipper 104 may include a handle 106 to facilitate the ease of opening the sheath 102. The zipper 104 may expend from one end of the sheath 102 to the other in the same manner as described above or may extend only partially the length of the sheath 102. The zipper 104 includes first and second tracks 110a 110b that are formed on the outer edges 112a, 112b of the fabric members comprising the sheath 102. The zipper 104 may further include a zipper member 114 that may have an optional tab 116 for securing the tracks 110a, 110b to each other.

As is shown in FIGS. 6B and 6C when the zipper 104 is unzipped, the sheath 102 can preferably lie in a generally planar configuration. This facilitates positioning of the cables 101 into the sheath 102. As described below, one or more cables 101 can be positioned within the sheath 102. In this embodiment, the interior portion 120 of the sheath 102 may be comprised of a plurality of pieces of fabric material 122 that are sewn together. In one implementation, the interior portion 120 is formed of a first, second and third pieces of fabric 122a, 122b and 122c that are sewn together so as to define two raised tabs 124a, 124b that extend outward from the interior portion 120 of the sheath. As is shown in FIG. 6B, the tabs 124a, 124b preferably extend the length of the sheath 102 and facilitate arranging the cables 101 into a more organized manner as will be described in greater detail below. In one specific, non-limiting implementation, the pieces of fabric 122 can be formed of a material such as a polyester blend material although persons of ordinary skill in the art can appreciate that various other materials can also be used without departing from the scope of the present invention.

In the interior pieces of fabric 122a, 122b, and 122c are sewn to the zipper tracks 110a, 110b in a well-known manner so as to define a seam 126. The seam 126 further connects the interior portion 120 of the sheath to an exterior portion 130 of the sheath 102.

As is also shown in FIG. 6C, the raised tabs 124a, 124b have seams 126 that extend across the raised seams 124a, 124b which induce the raised seams 124a, 124b to extend upwards away from the interior surface 120 of the sheath 102. This induces the raised tabs 124a, 124b to be positioned within the inner volume of the sheath 102 which provides guide tracks that guide cables 101 to extend along the length of the sheath 120. In one implementation, the interior surface 120 of the sheath is approximately 3.5 cm wide and the raised tabs 124a, 124b extend upwards approximately 0.5 cm. that the width it will be appreciated however of the sheath 102 and the length of the tabs 124a, 124b can vary depending on the number and size of the cords that are positioned within the sheath 102.

As is also shown in FIG. 6C, a stiffening member or wire 131, such as the members described above, can be positioned within the seam 124a. Preferably, the stiffening member 131 is positioned within the seam 124a for ease of manufacture and also because it spaces the stiffening member 131 from the interior surface 120 of the sheath 102. This results in the stiffening member 131 not being immediately adjacent the interior and exterior surfaces 120, 131 of the sheath 102 which results in less wear of the surfaces as a result of the stiffening member 130 rubbing against the surfaces during bending of the device 100. A further seam 126 is formed above the stiffening member 131 to secure the stiffening member 130 in the desired orientation away from the interior surface 130.

Figure 6D:
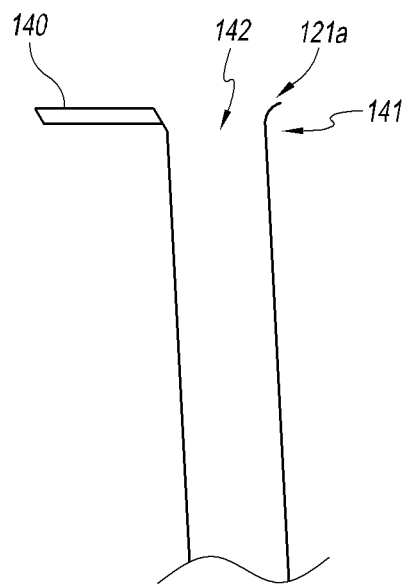
FIGS. 6D and 6E are partial perspective views of additional optional features of the cable management device shown in FIGS. 6A-6C.

The ends 106 of the sheath 102 may vary depending upon the implementation. As shown in FIG. 6D, one end 121a, may have a flap 140 that covers the end opening 142, and is preferably sealable using a releasable fastener such as hook and loop fastener, zippers buttons or the like. A cord 1 such as the cord illustrated in FIG. 1 will have an end piece 151 (FIGS. 1 and 7B) which can comprise a plug or ear plugs or some type of larger diameter device. This portion of the cord 1 extends out of the opening 142 in the end 121a. However, to inhibit the end piece 151 from falling back into the interior volume of the sheath, the flap 140 may extend over the end 121a. Further, the end 121a may also be flared outward 141 to facilitate removal of the end piece 151 and also permit more flexibility of movement of the end pieces 151 and the cable 1. More specifically, since the end 121a is flared, movement of the end piece 151 outward from an axis defined by the sheath 102 will result in less contact between the cord and the edges 121 of the sheath 102 which results in less potential for damage or wear to the edge of the sheath member 102. These features will be described in greater detail in reference to FIGS. 8A-8F described below.

Figure 6E:
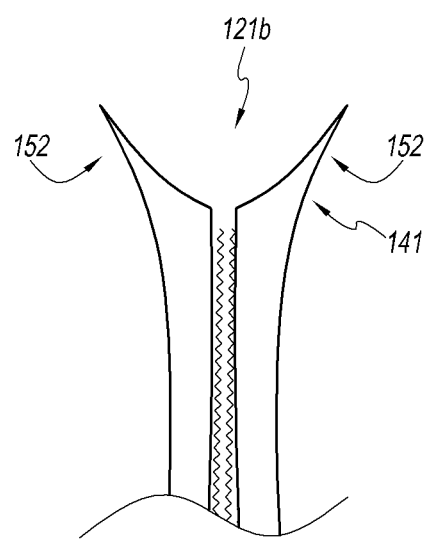

The other end 121b shown in FIG. 6E may also be flanged or have a slit so as to permit easier installation of the cords. More specifically, as shown in FIG. 6E, the end 121b may also be more broadly flared out 141 either through the inclusion of a slit or by having a larger diameter section of the sheath 102 adjacent the end 121b. The end pieces 151 can have varying sizes and inserting the end pieces into the sheath 102 can be complicated in implementations where the zipper 104 does not extend the entire length of the sheath 102. To facilitate installation of the end pieces 151 of the cord 1 into the device 100, the ends may be flared outward 152 or have slits (described in greater detail below in reference to FIGS. 8A-8E) which also provide additional protection to the sheath 120 in the manner described above. The extent to which the end 121a, or 121b is flared is dependent upon the size of the end pieces of the cord 1. It will be appreciated that some end pieces are relatively small, e.g., jacks for plugging into phones etc. and some might be larger, e.g., plugs for plugging into electrical outlets so the size of the sheath 102 and the openings 121a, 121b will vary depending upon implementation without departing from the spirit or scope of the present invention.

Figure 7A:
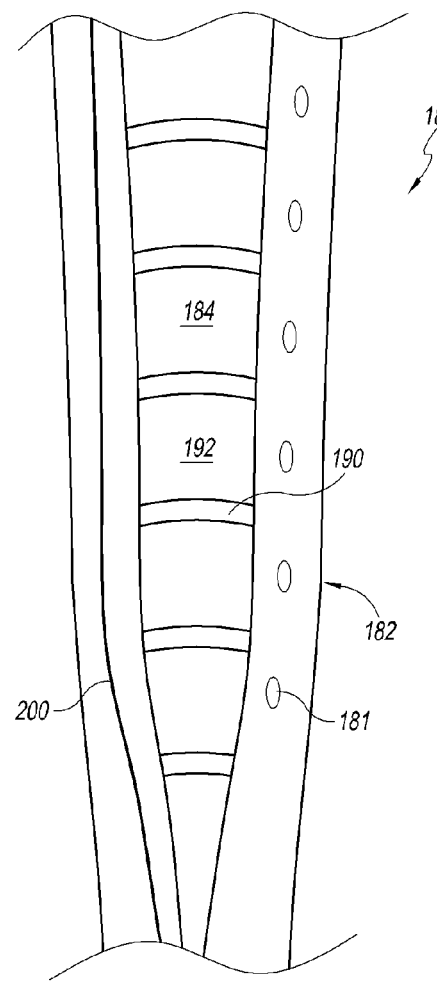
FIGS. 7A and 7B are perspective views of another embodiment of a cable management device.
Figure 7B:
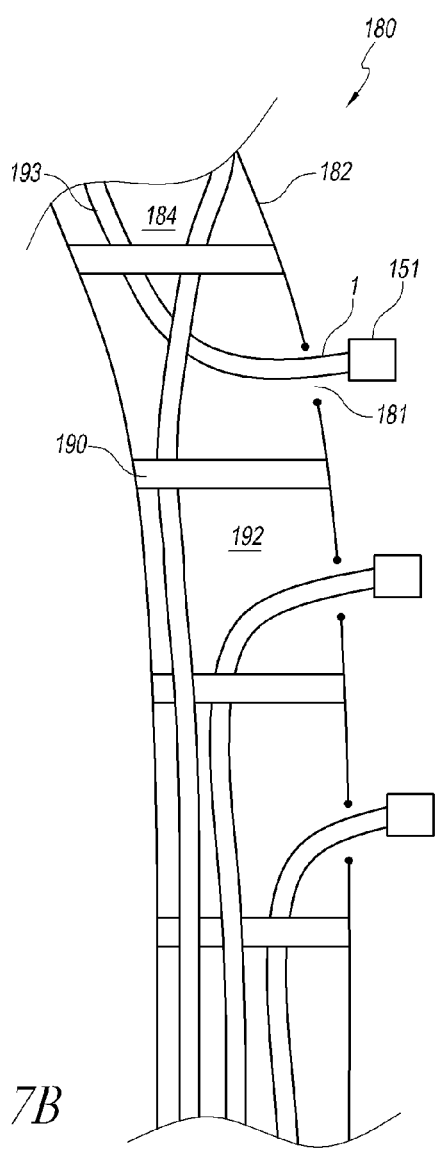

FIGS. 7A and 7B illustrate another embodiment of a cord organization device 180. In this implementation, the device 180 includes a sheath 182 formed of a material such as a blend of polyester. Moreover, the device 180 may be formed to have a larger diameter to accommodate a larger number of cords. It will be appreciated that some devices may be used for one or two cords simply to protect the cord and can be used in individual applications, such as a person using the cord to protect their ear phone cords or to protect their power cord for their cellular phone, pad device or the like. In other implementations, larger numbers of cords, such as the cords connecting various components of a desk top computer and associated accessories such as printers, displays, handsets, scanners, etc. may also be positioned within a cable management device 180 so as to accommodate the cords. Placing large numbers of cords into such a device provides protection to the cords in that the cords are less likely to be dislodged and also provide a more aesthetic appearance.

FIGS. 7A and 7B illustrate an embodiment of a cord organization device 180 that includes side openings 181 that permit the cords 1 to be removed out of the interior volume of a sheath 184 at spaced intervals. To facilitate positioning multiple cords within the sheath 182, a plurality of rigid or semi-rigid rings 190 may be formed on an inner wall 192 of the sheath 182. In one implementation the rings 190 are made of plastic but other suitable materials can also be sued. The 190 rings are preferably positioned so as to be adjacent the side openings 181. As is shown in FIG. 7B, the cords 1 can be positioned underneath the rings 190 so that the rings 190 secure the cord 1 against the inner wall 192 of the device 180.

In this way, the length of cord 1 that extends out of the side openings can be regulated which further allows for cord management. It will be appreciated that similar rings can be used in the same manner to regulate the length of cord that extends out of the end openings such as the end openings 121a, 121b of the embodiments shown in FIGS. 6A-6E and FIGS. 8A-8F described below. In all disclosed embodiments, slack cord can be stored within the cord management device such that the amount of cord that extends outward of the management device can be regulated. In one implementation, as shown in FIG. 7B, the cord can be looped 193 and the loop 193 can then be secured by a retainer or ring 190.

The side openings 181 may be formed along an edge 194 of a slit 196 that is formed to permit installation of the cords into the interior volume 184 of the sheath and the slit 196 may be sealed using a zipper or similar device in the same manner as described above. The side openings 181 may also be formed elsewhere along the sheath 182 and can be sized to accommodate different sizes of cables and cable end pieces 150.

As is also shown in FIG. 7A, a stiffening member 200 may also be included into the sheath 182 that performs the same purpose as described above. More specifically, the stiffening member 200 allows the cable organization device 180 to be bent into a desired orientation or configuration and then maintained in this orientation or configuration. With larger cable assemblies or with more cables, the stiffening member 200 may need to be thicker to resist the tension of the cables to retain the organization device 180 in a desired configuration.

As shown in FIGS. 8A-8F, a cable management device 100 may comprise an elongate sheath 102, a zipper 104, a first end 121a, and a second end 121b. The elongate sheath 102 may be of a generally tubular shape, and may comprise a space 120 inside of the sheath. The elongate sheath 102 may comprise a wire or stiffening member 131 within at least part of the sheath 120. The wire 131 may comprise a generally ductile metal, such as copper, or other similar material, that may be re-shaped multiple times without significant permanent deformation. The elongate sheath 102 may comprise a fabric that may be ribbed, and or radially expandable. The elongate sheath 102 may be between several inches and several feet long, and in some embodiments, may be 2 feet, 3 feet, or 4 feet in length, or another length.

In some embodiments, the cable management device 100 may comprise a zipper 104, or other structure configured to close at least part of the sheath 102. The sheath 102 may comprise an opening 111 axially along at least part of the sheath 102, and the zipper 104 may be configured to at least temporarily close part of the opening 111. The zipper 104 may extend from a first end 121a of the sheath 102 to a second end 121b of the sheath 102. When the zipper 104 is zipped, at least part of the zipper 104 may be hidden from view. For instance, as a non-limiting example, when the zipper 104 is zipped, at least some of the teeth of the zipper 104 may not be visible or fully visible. When the zipper 104 is unzipped, at least part of the inside 120 of the elongate sheath 102 may be exposed. The wire 131 may be disposed in at least part of the inside 120 of the sheath 102. In some embodiments, the zipper 104 may not completely unzip, such that material on one side of the zipper 104 may not become fully detached from material on the other side of the zipper.

Figure 8A:
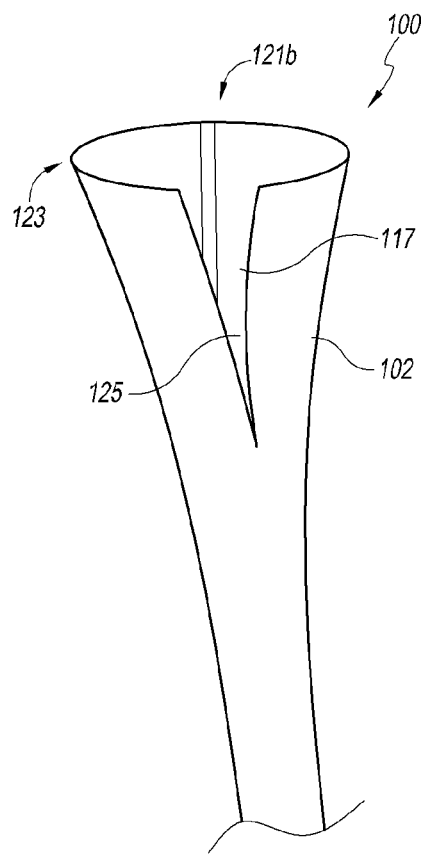
FIGS. 8A-8F are perspective views of another embodiment of a cable management device.
Figure 8B:
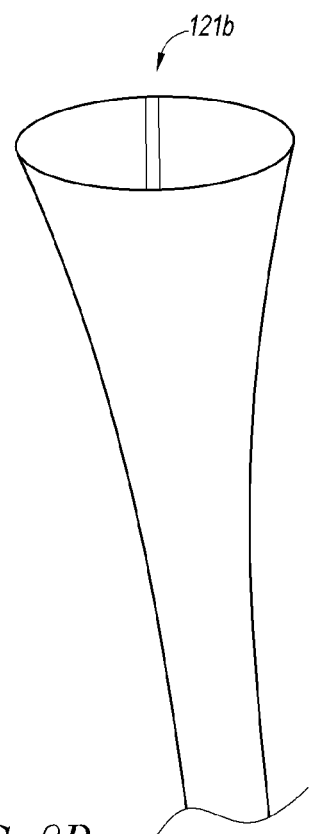

As shown in FIGS. 8A and 8B, the elongate sheath may comprise a second end 121b. The second end 121b may be disposed at or near the bottom of the zipper 104. In some embodiments, the second end 121b comprises a flare shape 123, such that the diameter or cross-sectional area of the elongate sheath 102 may generally increase towards the first end. As shown in FIG. 8A, in some embodiments, the second end 121b may comprise a slit 125 that extends longitudinally from the second end 121b of the sheath 120 at least partially towards the first end 121a of the sheath 120. As shown in FIG. 8B, in some embodiments, the sheath 120 may not substantially comprise a slit, such that the bottom edge of the sheath extends substantially circumferentially around the sheath.

Figure 8C:
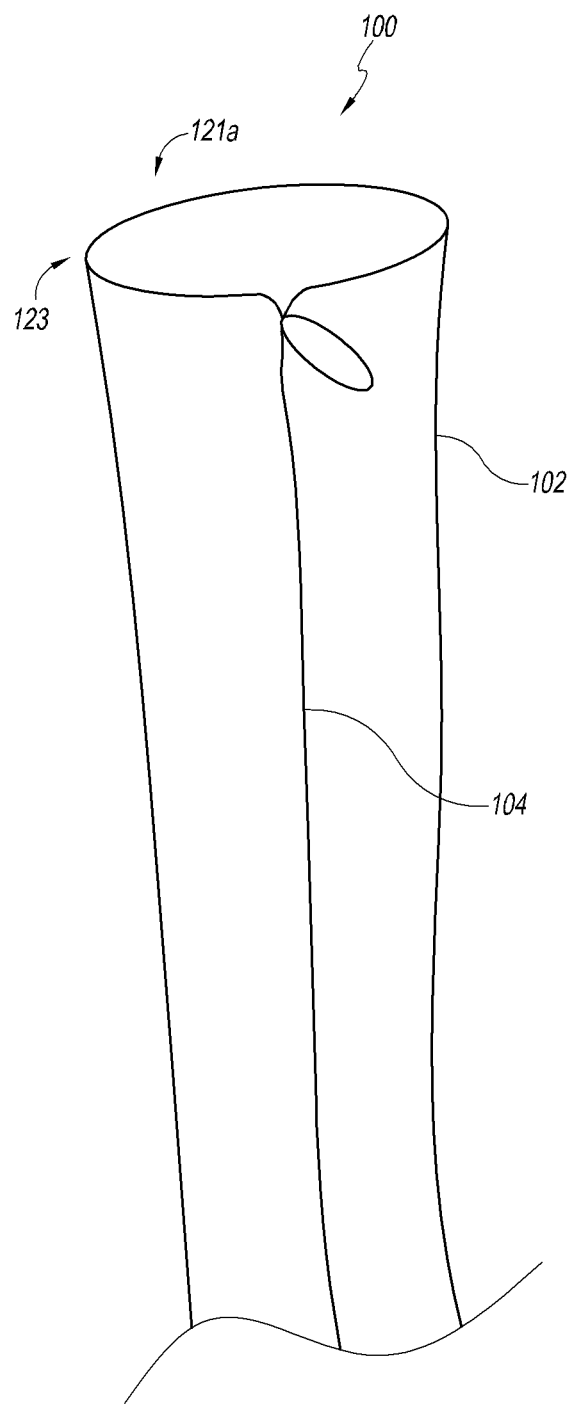
Figure 8D:
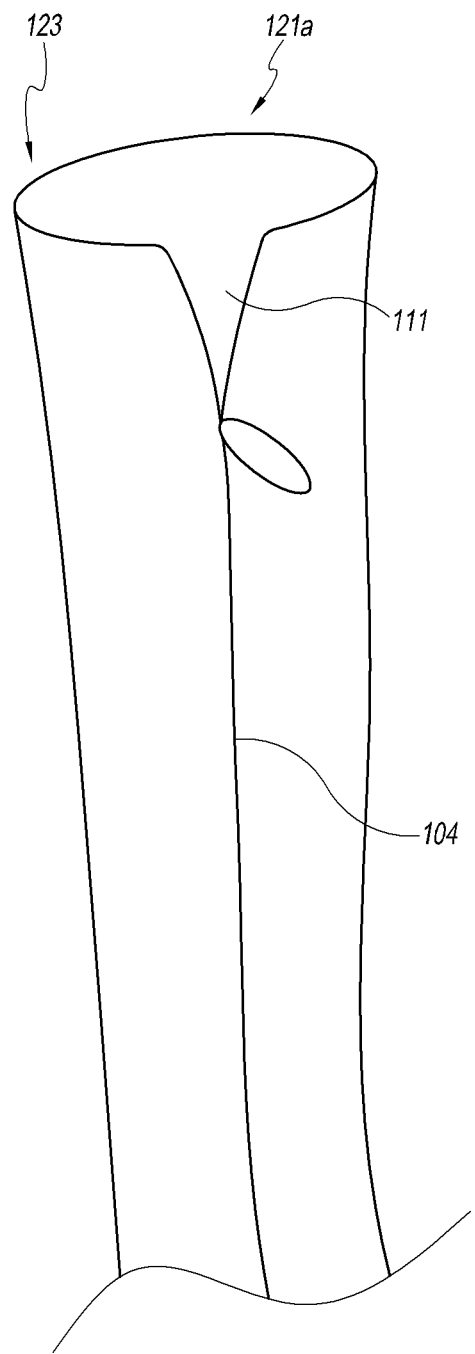
Figure 8E:
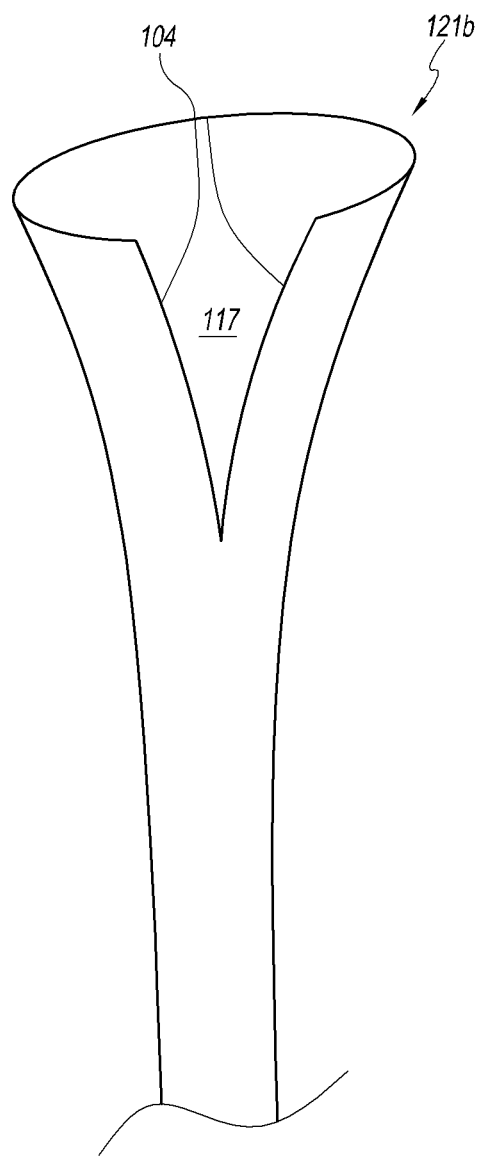

With continued reference to FIGS. 8A and 8B, and as shown in FIG. 8E, the second end 121b may be configured such that when the zipper 104 is unzipped to the second end 121b or close to the first end 122a, the second end 121b defines a void 117 through which a cable may be inserted. In some embodiments, a slit 125 may aid with insertion of a cable. In some embodiments, the flare shape of the second end 121b may aid with insertion of a cable. For instance, as a non-limiting example, when the zipper 104 is unzipped, it may be disposed at or near the second end 121b of the sheath 102. An opening may be formed through the sheath 102, such that a cable may be inserted through the opening in the bottom of the sheath, and through the opening or void 117 created by the unzipped zipper 104.

Since some cables have ends that are larger in diameter or cross-sectional area, it may be advantageous to have a larger opening through which the cable may be disposed. Once the cable has been at least partially inserted through the opening in the end 120b and through the opening 117 created by the zipper, the zipper 104 may be at least partially zipped up. Since, in some embodiments, the process of closing the zipper 104 may dispose the material of the sheath 102 more tightly around the cable, the cable may become more secure within the sheath 102 as the zipper 104 is engaged. In some embodiments, if the sheath 102 was substantially tubular shaped at the first end, and the zipper 104 did not fully unzip, then it may be difficult to insert a cable and/or ends of a cable into and through the cable management device. Although the first end of the sheath may comprise a flare shape, other shapes may perform equally as well, and the scope of the invention is not limited to the shape of the first end of the elongate sheath.

As shown in FIGS. 8C and 8D, the elongate sheath 102 may comprise a first end 121a that is on the opposite end of the sheath 102 as compared to the first end 121a. The first end 121a of the sheath may be at or near the top of the zipper 104. In some embodiments, the second end may comprise a flare shape 123b, or a change in diameter or cross-sectional area of the sheath. In some embodiments, the flare shape 123 at the first end 122b may not be as large or pronounced as a flare shape 123 at the second end 121a of the sheath 102. In some embodiments, the first end 121a may not comprise a slit, such that when the zipper 104 is fully zipped the first end 121a of the sheath is generally circumferentially continuous around the first end 121a of the sheath 102. The first end 121a of the sheath 102 may be configured such that when the zipper 104 is zipped up to the first and or near the first end 121a and minimal space may exist between the cable and inside surface 120 of the sheath. The first end 121a of the sheath 102 may comprise a hem or folded-over piece of fabric.

Figure 8F:
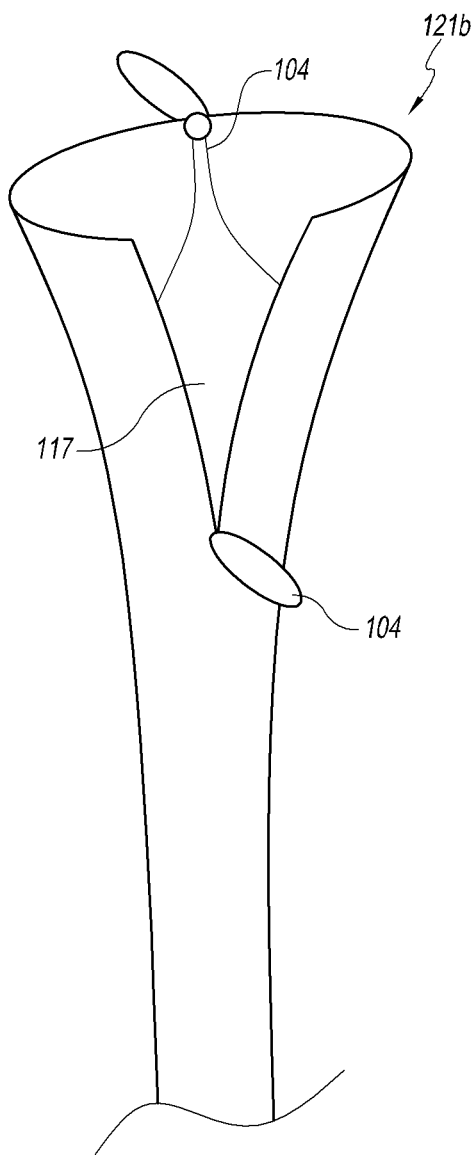

FIG. 8F illustrates that the flared end 121b of the sheath 102 can have a slit 111 that is also closed by a zipper 104. Consequently, the slit 111 can be used to facilitate the installation of the cable into the sheath 102 and can then be removed to provide more secure retention of the cords. As is also shown in FIG. 8F, the zipper 104 on the slit 111 is in addition to the zipper 104 that extends the entire length or substantially the entire length of the sheath 102.

Figure 9A:
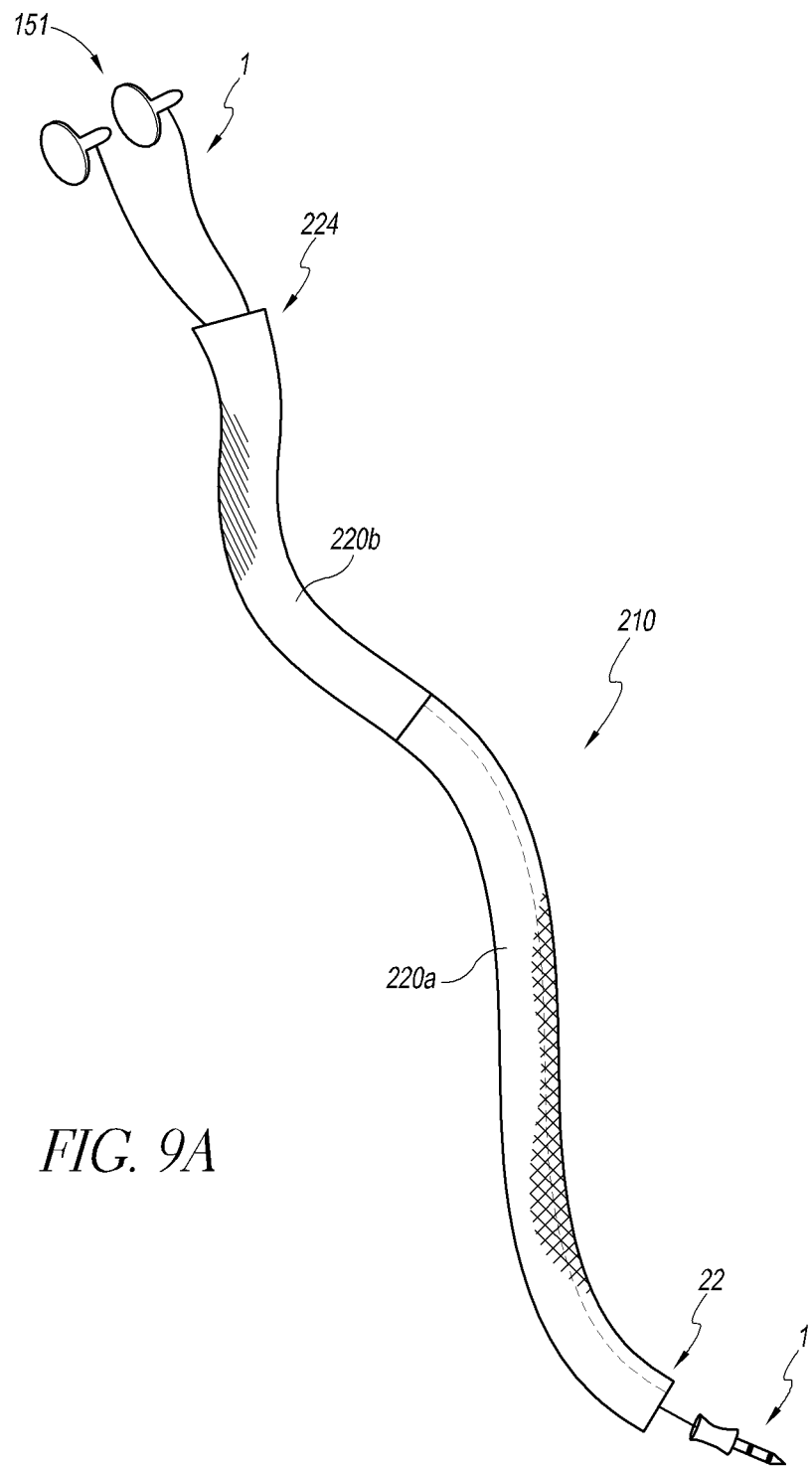
FIGS. 9A and 9B are perspective views of another embodiment of a cable management device.
Figure 9B:
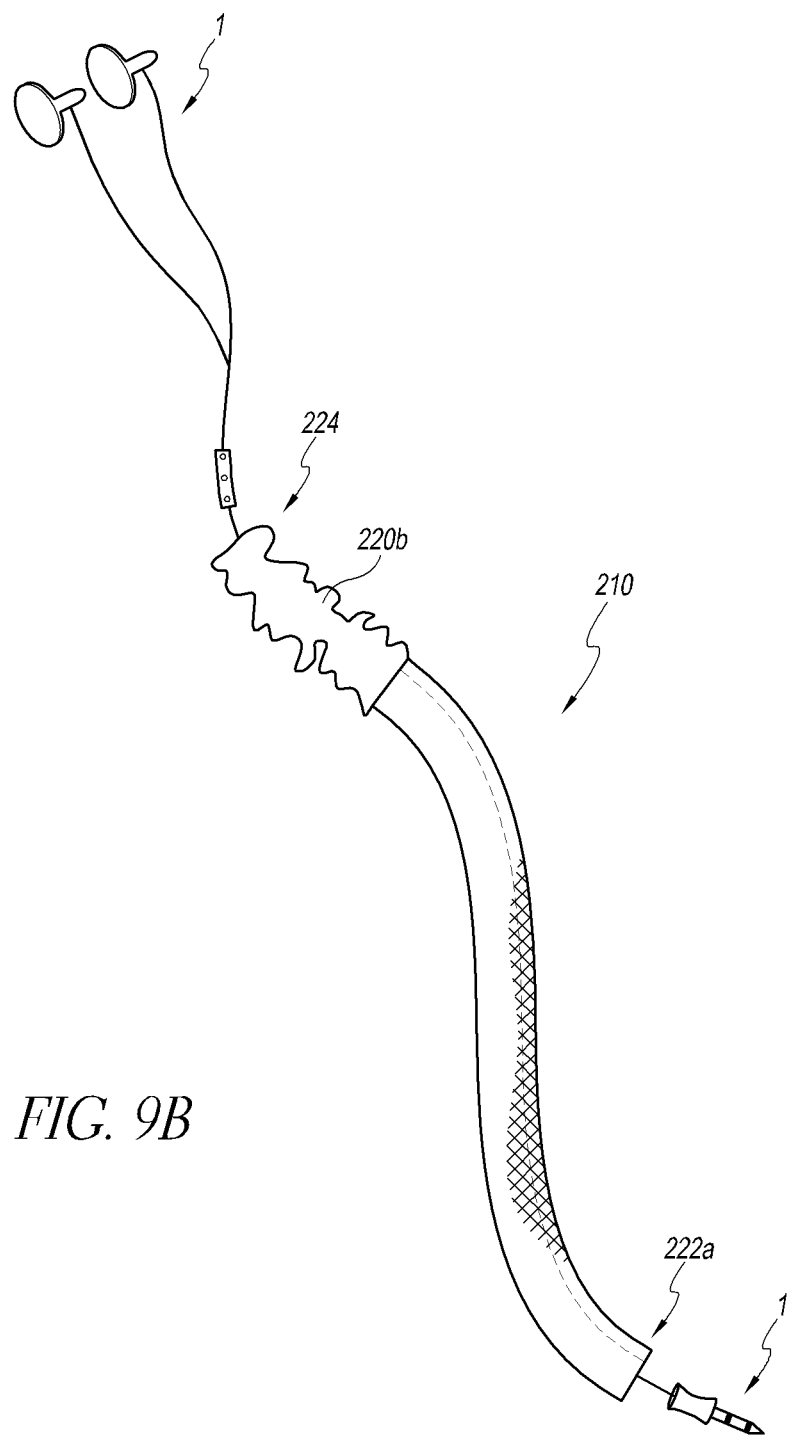

FIGS. 9A and 9B illustrate another embodiment of a cable management device 210. In this embodiment, the cable management device 210 includes a first sheath 220a and a second sheath 220b. The first sheath 220a is formed of a more resilient fabric such as the polyester blend fabric described above. The first sheath also includes the stiffening member or wire 230. The cords 1 are positioned in the first sheath 220a in the same manner as described in the various embodiments above and the first sheath 220a can incorporate any of the previously described features.

As shown in FIGS. 9A and 9B, however, the device 210 also includes a second sheath 220b. More specifically, the second sheath or cover member 220b does not include the stiffening element and is preferably formed of a softer fabric. The second sheath 220b can be used to cover devices such as ear phone cords with a softer fabric. In this way, when a user places ear phones in their ears, the softer fabric of the second sheath 220b may be more pleasant than the more robust fabric of the first sheath 220a.

In one embodiment, the second sheath 220b does not include the stiffening element 230 and is also collapsible in the manner shown in FIG. 9B. This permits the second sheath 220b to be vertically displaced from the end pieces 150. In one implementation, this is advantageous if the end pieces are items such as ear phones that have to be laterally separated from each other and have separate cords. By collapsing the second sheath 220 in the manner shown in FIG. 9B, the separate cords of the ear phone can be more easily separated. In one implementation, the outer end 224 of the second sheath 220 has a resilient member in it, such as an elastic band, that allows the outer end 224 of the second sheath 220 to engage to the cords so as to be maintained in a desired position along the cords 1.

In some embodiments, the cable management device may be configured such that a cable, including an audio or power cable, may be disposable within at least part of the elongate sheath 102, such as in the inside 120 of the sheath 102. The elongate sheath 102 may be configured to protect a cable inside against crimping, wear, abrasion, sharp objects, or various other dangers that may negatively affect a cable. The cable management device may be of a similar length as a cable contained within, or may be of another length. The cable management device may be colored or textured, or have other surface features. The cable management device may comprise a decorative zipper pull, or other decorative or functional features attached to at least part of the sheath or zipper. In some embodiments, the cable management device may be worn as an accessory or garment. In some embodiments, the cable management device may be configured to effectively shorten the length of cable, by twisting, folding, knotting, or otherwise configuring the device such that the first end of the cable is closer to the second end of the cable than were the cable to be fully outstretched. In some embodiments, the cable management device may be configured to support a phone. For instance, as a non-limiting example, the cable management device may be folded into an L-shape, or other shape, such that when the phone or other electronic device is placed on its edge on or near the cable management device the phone may generally remain in an upright position and resist falling or repositioning onto a broadside. In some embodiments, the cable management device may be configured to hang and/or support a phone or other electronic device.

FIGS. 10-14 illustrate an embodiment of a cable management device 300. The cable management device 300 can be configured to organize and/or store a cable 1 (e.g., headphones, power cord, USB cord, etc.). The cable management device 300 can be configured to perform many or all of the functions described above with respect to the devices 10, 100, 180, and 210.

As illustrated, the device 300 can have a sleeve portion 304. The sleeve portion 304 can have a first end 308, a second end 312, and a length defined therebetween. In some embodiments, the sleeve portion 304 has a generally tubular (e.g., cylindrical, flattened tube-shaped, etc.) shape. A first strap 316 can be attached (e.g., sewn, adhered, welded, stapled, or otherwise attached) to the sleeve portion 304 at or near the first end 308 of the sleeve portion 304. A second strap 320 can be attached to the sleeve portion 304 at or near the second end 312 of the sleeve portion 304. One or both of the first and second straps 316, 320 can be permanently attached to the sleeve portion 304. In some configurations, one or both of the first and second straps 316, 320 are releasably attached (e.g., via use of adhesive, hook and loop fasteners, buttons, zippers, etc.) to the sleeve portion 304.

Figure 10:
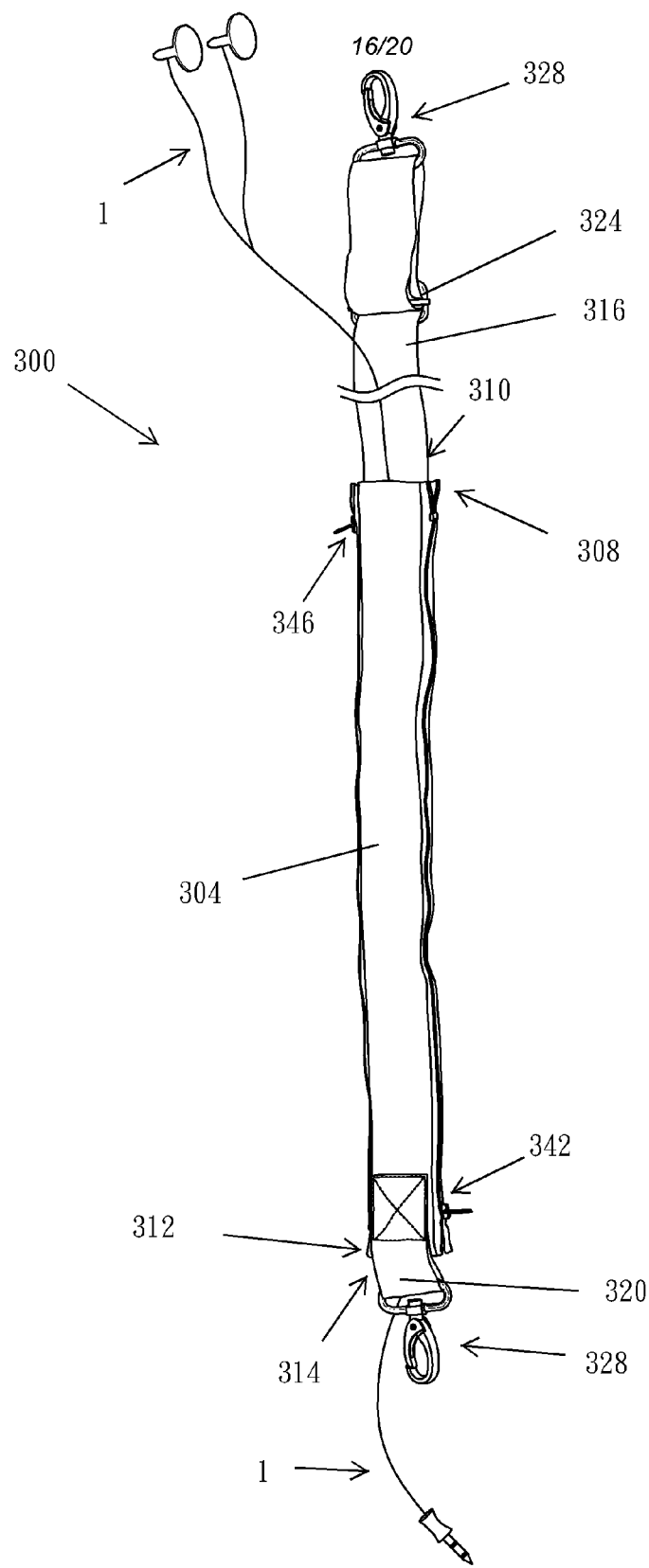
FIG. 10 is a front view of another embodiment of a cable management device including one or more straps.

One or both of the straps 316, 320 can have an adjustable length. For example, as illustrated in FIG. 10, the first strap 316 can include an adjustment mechanism 324 (e.g., a buckle or other mechanism). In some configurations, one or both of the straps 316, 320 has a fixed length (see, e.g., the second strap 320). Buckles, clips, buttons, or other attachment members 328 can be attached to one or both of the straps 316, 320. The attachment members 328 can be configured to facilitate fixed or releasable attachment between the straps 316, 320 and a storage container 330 (FIG. 14) (e.g., a briefcase, backpack, messenger bag, duffel bag, computer bag, item of luggage, etc.).

Figure 11:
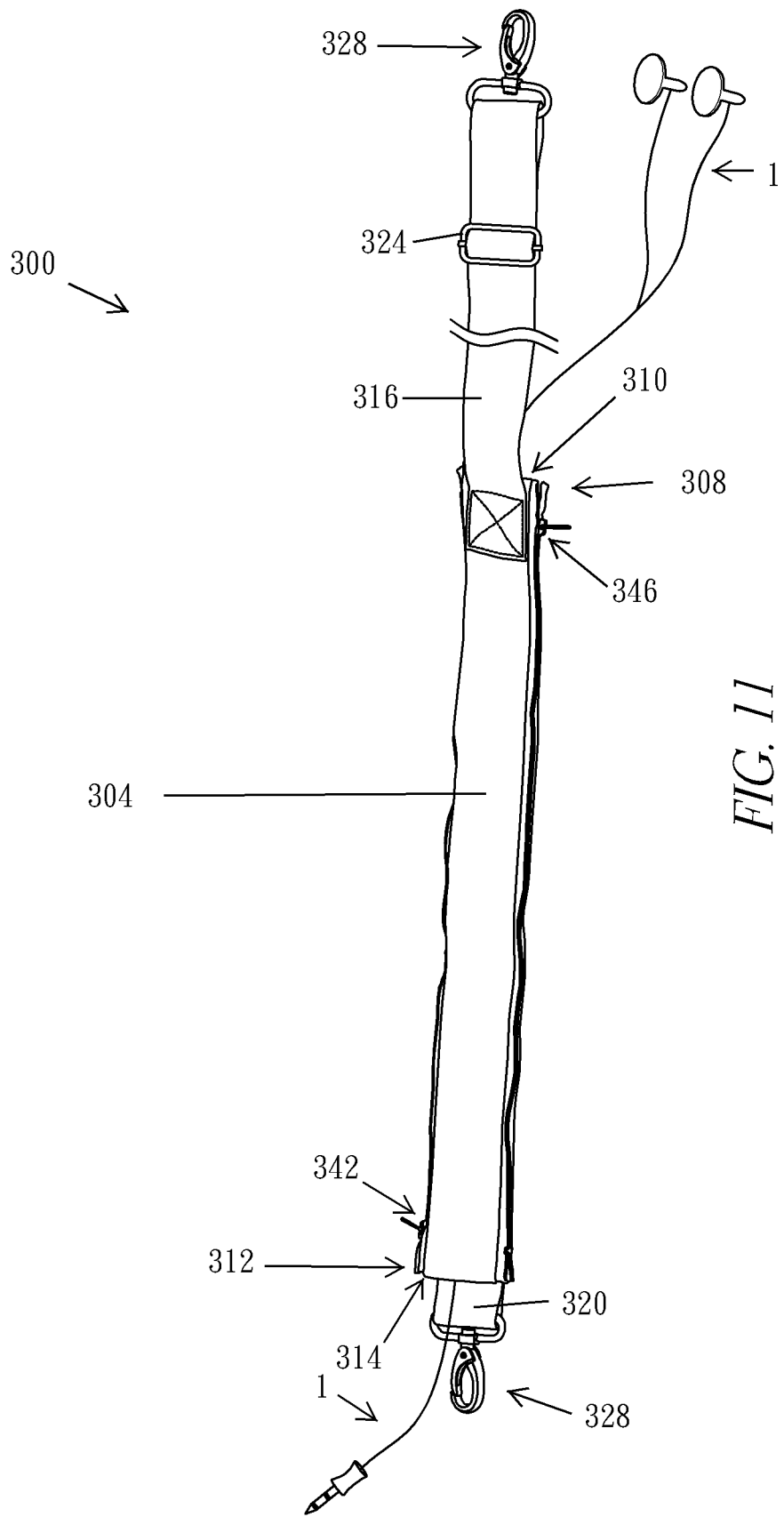
FIG. 11 is a back view of the device of FIG. 10.
Figure 12:
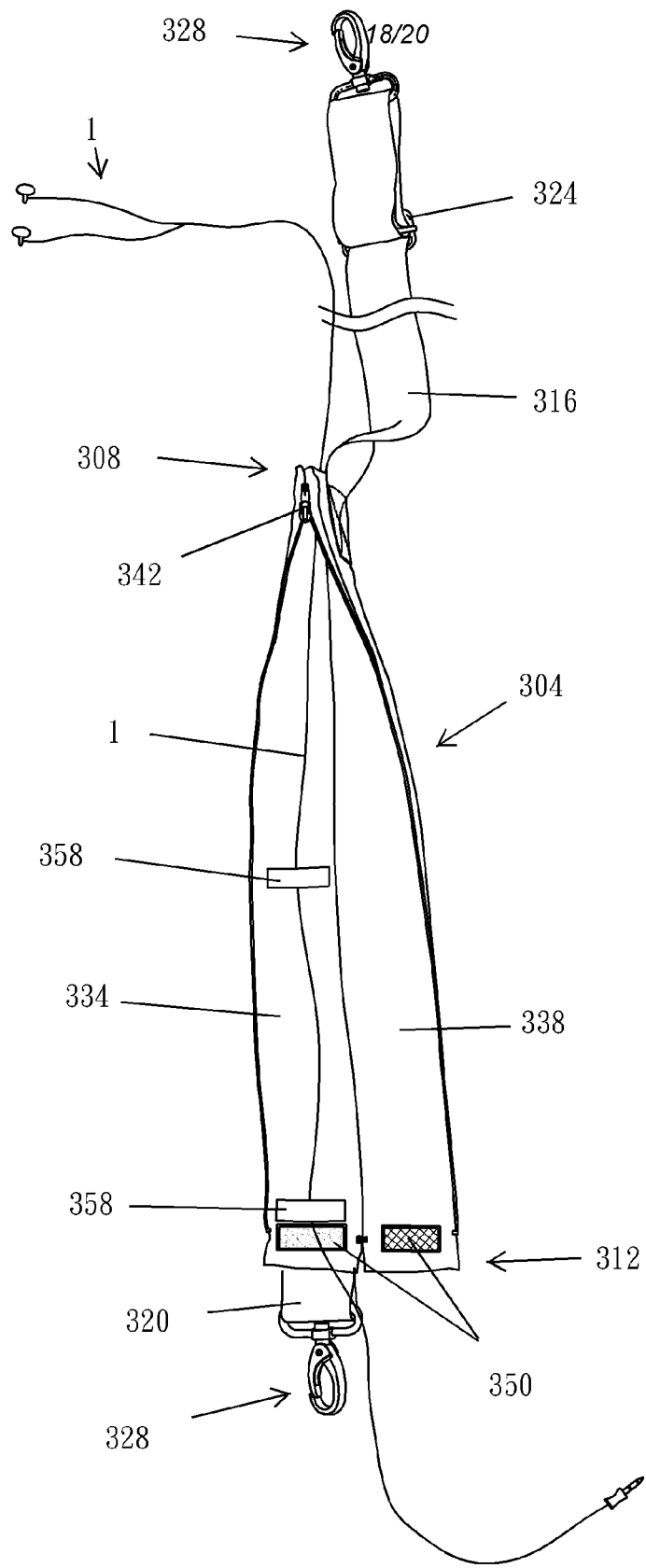
FIG. 12 is a perspective view of the device of FIG. 10 with one zipper in an unzipped configuration.
Figure 13:
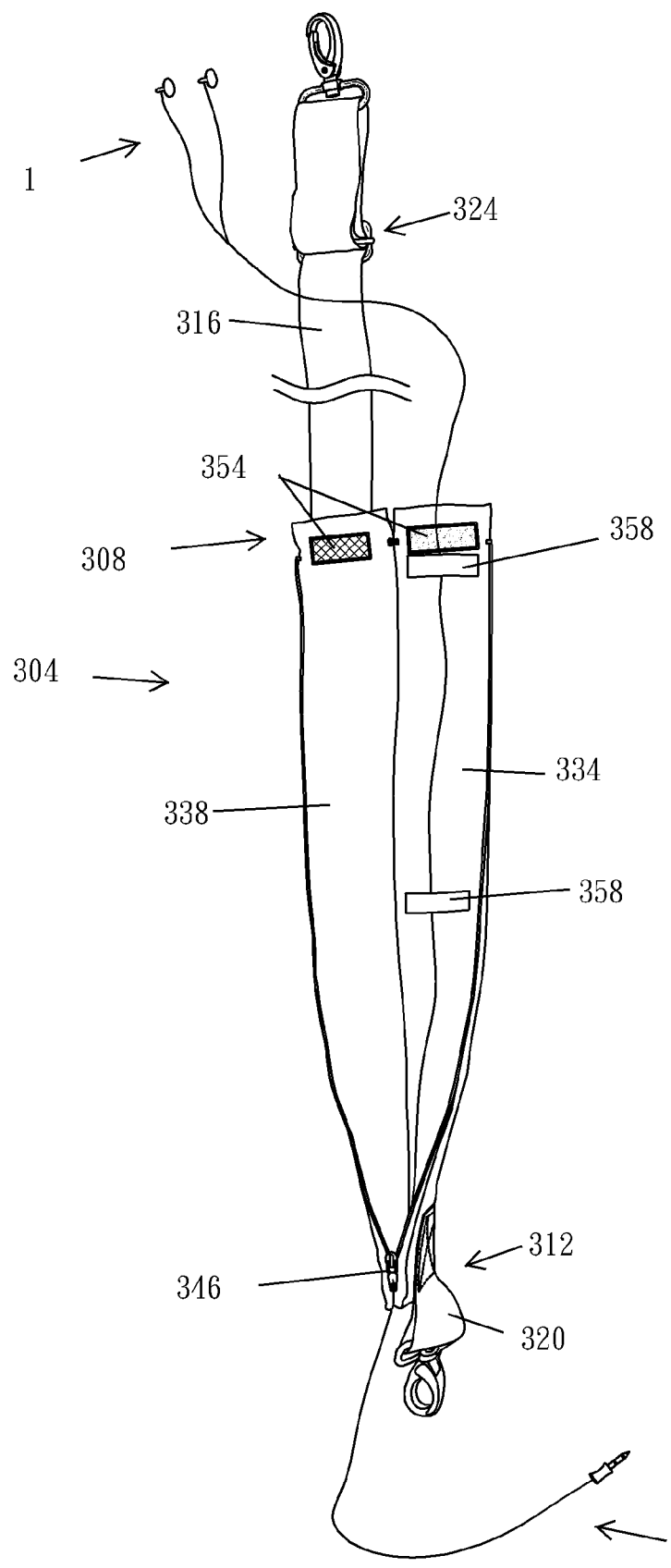
FIG. 13 is a perspective view of the device of FIG. 10 with another zipper in an unzipped configuration.

As illustrated in FIGS. 12 and 13, the sleeve portion 304 of the device 300 can include a plurality of sleeve sections. For example, the sleeve portion 304 can include a first sleeve section 334 and a second sleeve section 338. The sleeve sections 334, 338 can extend along all or a portion of the length of the sleeve portion 304. The sleeve sections 334, 338 can be permanently or releasably attached to each other. For example, a first zipper 342 can extend along all or a portion of the length of the sleeve portion 304. The first zipper 342 can connect an edge of each of the sleeve sections 334, 338 to each other. In some embodiments, the first zipper 342 unzips from the second end 312 to the first end 308 of the sleeve portion 304. The first zipper 342 can be configured to maintain connection between the first and second sleeve section 334, 338 in both an unzipped configuration (FIG. 12) and in a zipped configuration (FIGS. 10, 11, and 13). In some configurations, the first zipper 342 is configured to completely release from one or both of the sleeve sections 334, 338 when in the unzipped configuration.

The sleeve portion 304 can include a second zipper 346. The second zipper 346 can be extend along all or a portion of the length of the sleeve portion 304. The second zipper 346 can be configured to connect a second edge of each of the sleeve sections 334, 338 to each other. In some configurations, the second zipper unzips from the first end 308 to the second end 312 of the sleeve portion 304. In some cases, the second zipper 346 unzips in the same direction as the first zipper 342. As illustrated, the second zipper 346 can be configured to unzip in the opposite direction from the first zipper 342. The second zipper can be configured to maintain connection between the first and second sleeve section 334, 338 in both an unzipped configuration (FIG. 13) and in a zipped configuration (FIGS. 10-12). In some configurations, the second zipper 346 is configured to completely release from one or both of the sleeve sections 334, 338 when in the unzipped configuration. In some configurations, the first and second sleeve sections 334, 338 remain at least partially connected to each other when both the first and second zippers 342, 346 are unzipped. For example, the first zipper 342 can remain connected to both the first and second sleeve sections 334, 338 at or near the first end 308 of the sleeve 304 when the first zipper 342 is fully unzipped. In some embodiments, the second zipper 346 can remain connected to both the first and second sleeve sections 334, 338 at or near the second end 312 of the sleeve 304 when the second zipper 346 is fully unzipped.

As illustrated in FIGS. 12 and 13, the sleeve sections 334, 338 can include mating features 350, 354 positioned at or near the ends of the sleeve portion 304. The mating features 350, 354 can be configured to facilitate removable or fixed connection between the two sleeve sections 334, 338. The mating features 350, 354 can be used in addition to or instead of the zippers 342, 346.

In some embodiments, the mating features 350, 354 can comprise hook and loop fasteners, adhesive pads, buttons, and/or another mechanism configured to facilitate releasable coupling between the sleeve sections 334, 338. The mating features 350, 354 can be configured to function when a portion of the wire 1 is positioned between the features 350. For example, the first set of mating features 350 can be configured to mate together even when the wire 1 traverses a portion of the surface of the mating features 350. The second set of mating features 354 can be configured to function in the same or in a similar manner. Mating the mating features together while a portion of the wire 1 traverses the mating features can secure the wire 1 in lateral position (e.g., perpendicular to the length of the wire 1).

Referring to FIGS. 12 and 13, the cable management device 300 can include one or more cable retainers 358. The cable retainers 358 can be, for example, loops of flexible, resilient, and/or stretchable material. In some embodiments, the cable retainers 358 are constructed of a rigid or semi-rigid material.

As illustrated, the cable retainers 358 can be connected to one or more of the first and second sleeve sections 334, 338. For example, the cable retainers 358 can be connected to an inner surface (e.g., hidden surface when the sleeve sections are connected and closed together) of the first sleeve section 334. One or more cable retainers 358 can be connected to and distributed along the length of the first sleeve section 334. As illustrated, the device 300 can include a cable retainer 358 at or near each of the first and second ends 308, 312 of the sleeve portion 304. One or more cable retainers 358 can be positioned between the first and second ends 308, 312 of the sleeve portion 304.

The cable retainers 358 can be configured to perform the same or similar functions as the rings 190 described above. For example, the cable retainers 358 can be configured to retain the cable 1 (e.g., a portion of the cable 1 inserted through a retainer 358) against an inner surface of the sleeve portion 304. The cable retainers 358 can be configured to reduce the likelihood that the cable 1 is inadvertently disconnected from the cable management device 300.

Figure 14:
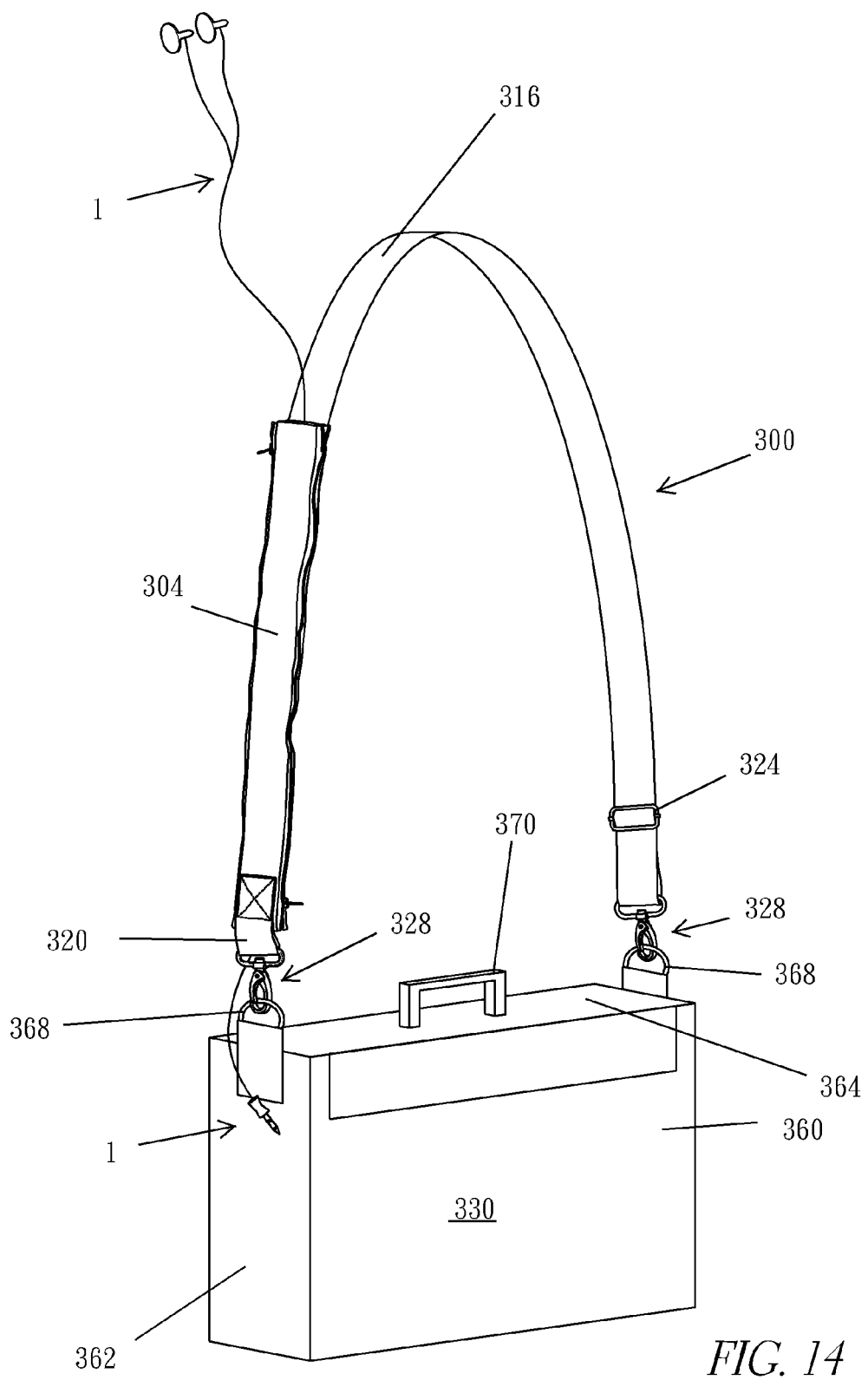
FIG. 14 is a perspective view of the device of FIG. 10 attached to a storage container.
Figure 15:
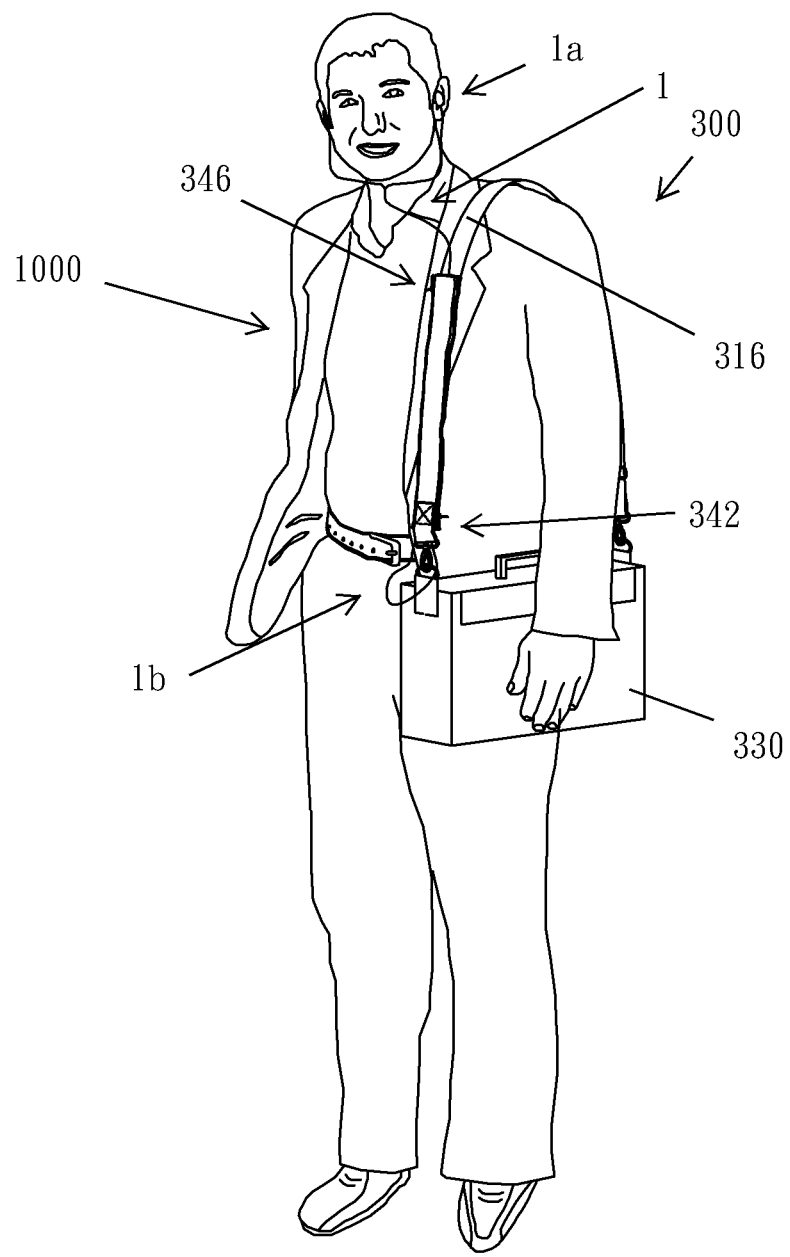
FIG. 15 is a perspective view of the device of FIG. 10 attached to a storage container and worn by a user over one shoulder.
Figure 16:
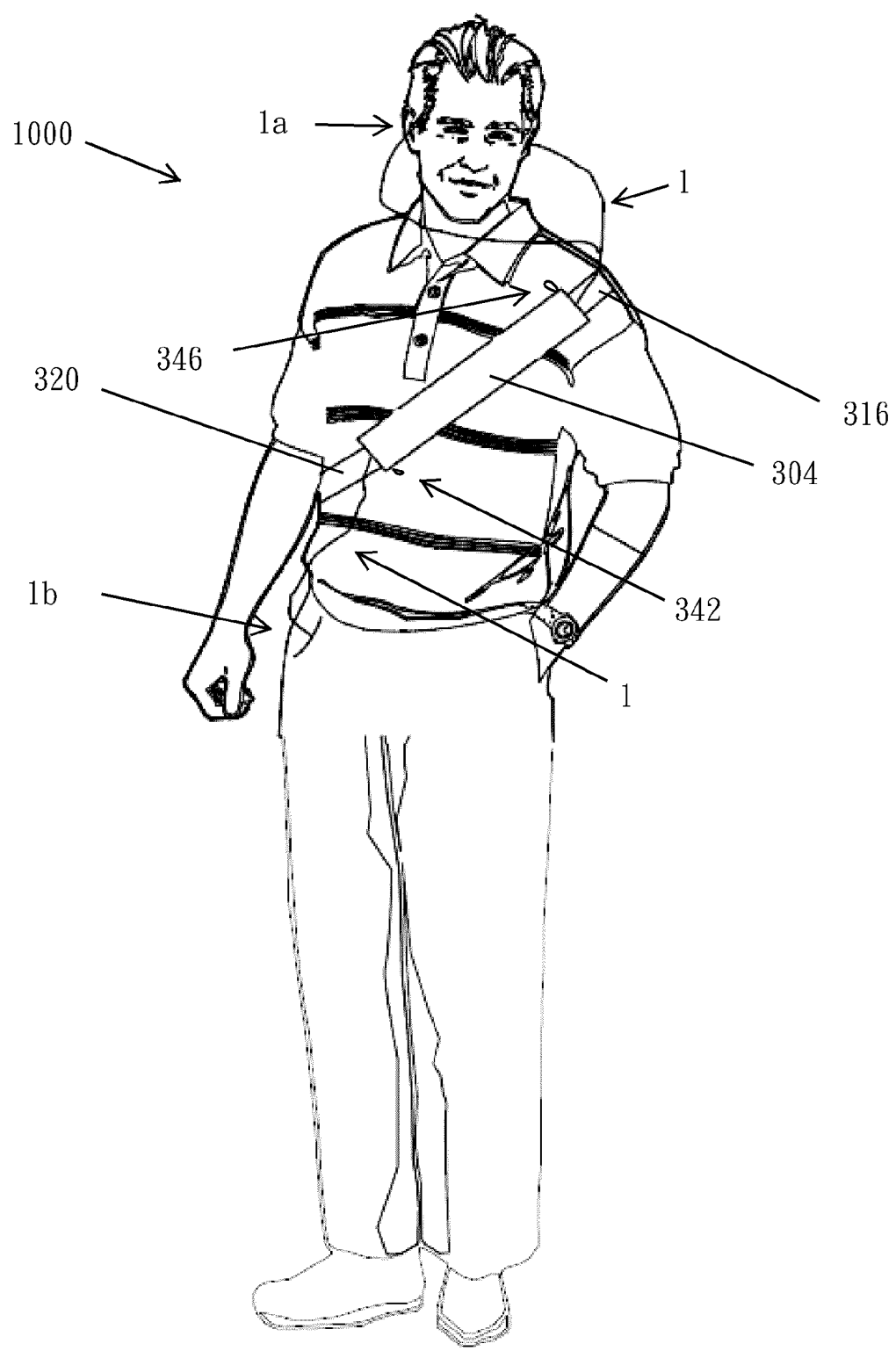
FIG. 16 is a front view of a user of the device of FIG. 10, wherein the device is used with a storage container and worn diagonally over the user's shoulder.

As illustrated in FIGS. 14-16, the cable management device 300 can be attached (e.g., releasably) to a storage container 330. For example, the attachment members 328 of the straps 316, 320 can connect to loops or other structures on the storage container 330. The length of one or more of the first and second straps 316, 320 can be adjusted to accommodate the desired carrying height of the storage container 330. As illustrated, the cable management device 300 can be worn over one arm and shoulder (FIG. 15) and/or over the chest (FIG. 16) of the user 1000.

The storage container 330 can have one or more side walls 360, end walls 362, and/or top walls 364. In some configurations, the storage container 330 includes only one wall (e.g., a soft-sided wall of a piece of luggage or other storage container). The wall(s) of the storage container 330 can form a storage interior. The storage container can include one or more loops or other connection members 368. The connection members 368 can be configured to fixedly or releasably connected with one or more of the attachment members 328 of the cable management device 300. In some embodiments, the storage container 330 includes a handle 370.

FIG. 14 illustrates an embodiment of an item of luggage 330 (e.g., storage container) such as a messenger bag, shoulder bag, tote bag, brief case or some other storage container for travel use. The item of luggage 330 can have one or more walls 360, 362, and 364 defining a storage space therein. The luggage 330 can include a shoulder strap (e.g., first and second straps 316, 320) having a compartment 304 for storing headphone or earbud cables and the like. The compartment 304 extends along at least a section of the shoulder strap. In one embodiment, the compartment 304 is disposed adjacent one end of the strap such that the compartment 304 can be readily accessible to a person carrying the item of luggage 330 using the shoulder strap 316. The compartment 304 can be integrally formed with or attached to the shoulder strap. FIGS. 12 and 13 illustrate in greater detail one embodiment of the compartment 304. As illustrated, the compartment 304 has an elongate configuration and a width that is substantially the same as the width of the shoulder strap. The compartment 304 can have an upper opening (e.g., first opening 310 in FIGS. 10-11) and a lower opening (e.g., second opening 314 in FIG. 10-11). The openings are configured to allow the end portions of cables stored inside to extend outwardly from the compartment 304. Attachment members (e.g., mating features 350, 354) such as hook and loop fasteners may be positioned along the opposing ends of the compartment to stabilize and secure the cables extending outwardly from the compartment. The compartment 304 can also include two opposing elongate lateral openings extending along the lateral edges of the compartment. The lateral openings allow the person carrying the item of luggage to easily access or store earbuds and cables without having to detangle the cables. Zippers (e.g., zippers 342, 346) or other attachment devices can be formed over the lateral openings to further secure the cables and cause the compartment to blend in with the shoulder strap and maintain a sleek appearance. In another embodiment, attachment members (e.g., cable retainers 358) such as elastic straps are positioned along interior of the compartment to secure the cables.

As illustrated in FIGS. 14-15, the first strap 316 can be longer than the second strap 320. The first strap 316 can be connected to the second sleeve section 338 at or near the first end 308 of the sleeve portion 304. In some embodiments, second sleeve section 338 is positioned closer to the user of the device 300 than the first sleeve section 334. Attaching the first strap 316 to a portion of the sleeve portion 304 closest to the user 1000 (FIG. 15) can reduce the likelihood of entanglement between the cable 1 (e.g., headphone cable) and the first strap 316. For example, the cable 1 can extend from the first end 308 of the sleeve portion 304 and in a direction away from the first strap 316 when the user 1000 wears the storage container 330 and headphones 1a.

The second strap 320 can be connected to a side of the sleeve portion 304 further from the user 1000 when the user 1000 wears the storage container 330 and headphones 1a. For example, the second strap 320 can be connected to the first sleeve section 334 at or near the second end 312 of the sleeve portion 304. In some embodiments, attaching the second strap 320 to the side of the sleeve portion 304 further from the user 1000 can reduce the likelihood of entanglement between the cable (e.g., the plug end 1b of a headphone cable) and the second strap 320 when the plug end 1b of the cable is inserted into a coat pocket, pant pocket, or other location wherein a media player or other device is stored. In some cases, attaching the second strap 320 to the side of the sleeve portion 304 reduces the length of cable 1 required to reach between the device (e.g., media player) and ears of the user 1000.

Positioning the cable management device 300 on the strap of a storage container 330 can enable efficient handling of the cable 1. For example, when going through airport security or other security checkpoints, a user 1000 can remove the headphones 1a from her or his ears and position the media player into which the plug end 1b is inserted into the storage container 330 with little or no risk of entangling or damaging the cable 1. In some configurations, utilizing the cable management device 300 as described above can reduce weight on the headphones 1a when the user 1000 wears the headphones and the storage container 330. For example, a portion of the cable 1 between the headphones 1a and the plug end 1b of the cable can be supported by the cable management device 300. The cable management device 300 can, in turn, be supported by the shoulder of the user 1000. In some such configurations, the effective weight upon the headphones 1a of the cable 1 could be limited to the portion of cable between the headphones 1a and the first end 308 of the cable management device 300.

According to some variants, a method of managing cables 1 can include unzipping at least one of the zippers 342, 346. The user can insert an end (e.g., the plug end 1b) of a cable 1 through one or more of the cable retainers 358. The unzipped zipper(s) 342, 346 can be re-zipped to at least partially enclose a portion of the cable 1 within the sleeve portion 304 of the device 300. In some embodiments, the user 1000 can attached the device 300 to a storage container 330. For example, the user 1000 can connect the attachment members 328 of the device 300 to the connection members 368. The user 1000 can wear the device 300 and/or storage container 330 over one or both shoulders (FIGS. 15 and 16). The plug end 1b can be plugged into a media device and the media device can be inserted into the user's pocket, into the storage container 330, and/or held in the user's hand.

In some embodiments, the user 1000 can remove the headphones 1a from her ears. The headphones portion 1a of the cable 1 can be stored in the sleeve portion 304 of the device 300. For example, the user 1000 can unzip the second zipper 346 and/or unmate the mating features 354 from each other. The user 1000 can insert the headphones 1a into the sleeve 304. In some case, the user 1000 can then re-zip the zipper 346 and/or re-mate the mating features 354, leaving the headphones 1a positioned within the sleeve 304. In some configurations, the user 1000 can remove the plug portion 1b of the cable from the media device into which it is plugged. The user 1000 can unzip the first zipper 342 and/or unmate the mating features 350. The user can insert the plug portion 1b of the cable 1 into the sleeve portion 304. In some cases, the entire cable 1 can be stored in the sleeve portion 304. The user can re-zip the first zipper 342 and/or re-mate the mating features 350 to store the plug portion 1b in the sleeve portion 304 of the device 300.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the device as implemented.

Certain features that are described in this specification in the context of separate implementations also can be implemented in combination in a single implementation. Conversely, various features that are described in the context of a single implementation also can be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination. Similarly, while operations are depicted in the drawings in a particular order, this should not be understood as requiring that such operations be performed in the particular order shown or in sequential order, or that all illustrated operations be performed, to achieve desirable results.

In describing the present technology, the following terminology may have been used: The singular forms "a," "an," and "the" include plural referents unless the context clearly dictates otherwise. Thus, for example, reference to an item includes reference to one or more items. The term "ones" refers to one, two, or more, and generally applies to the selection of some or all of a quantity. The term "plurality" refers to two or more of an item. The term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art. The term "substantially" means that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide. Numerical data may be expressed or presented herein in a range format. It is to be understood that such a range format is used merely for convenience and brevity and thus should be interpreted flexibly to include not only the numerical values explicitly recited as the limits of the range, but also interpreted to include all of the individual numerical values or sub-ranges encompassed within that range as if each numerical value and sub-range is explicitly recited. As an illustration, a numerical range of "about 1 to 5" should be interpreted to include not only the explicitly recited values of about 1 to about 5, but also include individual values and sub-ranges within the indicated range. Thus, included in this numerical range are individual values such as 2, 3 and 4 and sub-ranges such as 1-3, 2-4 and 3-5, etc. This same principle applies to ranges reciting only one numerical value (e.g., "greater than about 1") and should apply regardless of the breadth of the range or the characteristics being described. A plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items. The term "alternatively" refers to selection of one of two or more alternatives, and is not intended to limit the selection to only those listed alternatives or to only one of the listed alternatives at a time, unless the context clearly indicates otherwise.

It should be noted that various changes and modifications to the presently preferred embodiments described herein will be apparent to those skilled in the art. Such changes and modifications may be made without departing from the spirit and scope of the invention and without diminishing its attendant advantages. For instance, various components may be repositioned as desired. It is therefore intended that such changes and modifications be included within the scope of the invention. Moreover, not all of the features, aspects and advantages are necessarily required to practice the present invention. Accordingly, the scope of the present invention is intended to be defined only by the claims that follow.

What is claimed is:

1. A portable storage container comprising:
    one or more walls defining a storage space;
    a first connection member connected to one or more of the one or more walls;
    a second connection member connected to one or more of the one or more walls; and
    a cable management device comprising:
        a sleeve portion having a first end, a second end, a hollow interior, and a sleeve length between the first and second ends of the sleeve portion;
        a first strap having a first end and a second end, the first end connected to the first end of the sleeve portion;
        a second strap having a first end and a second end, the first end connected to the second end of the sleeve portion;
        a first attachment member connected to the second end of the first strap, the first attachment member configured to connect with a structure on a storage container;
        a second attachment member connected to the second end of the second strap, the second attachment member configured to connect with a structure on a storage container.

2. The portable storage device of claim 1, wherein the sleeve portion comprises:
    a first sleeve section extending along at least a portion of the sleeve length; and
    a second sleeve section extending along at least a portion of the sleeve length, the second sleeve section connected to the first sleeve section, wherein the hollow interior of the sleeve portion is between the first sleeve section and the second sleeve section.

3. The portable storage device of claim 2, wherein the first sleeve section is connected to the second sleeve section via a first zipper along at least a portion of the sleeve length.

4. The portable storage device of claim 3, wherein the first sleeve section is connected to the second sleeve section via a second zipper along at least a portion of the sleeve length.

5. The portable storage device of claim 4, wherein the first zipper unzips toward the first end of the sleeve portion with respect to the second end of the sleeve portion, and wherein the second zipper unzips toward the second end of the sleeve portion with respect to the first end of the sleeve portion.

6. The portable storage device of claim 1, wherein the sleeve portion comprises an inner surface and a plurality of cable retainers connected to the inner surface of the sleeve portion along the sleeve portion length, each of the cable retainers comprising a flexible loop configured to retain a portion of a cable against the inner surface of the sleeve portion when the portion of cable is inserted through the respective cable retainer.

7. The portable storage device of claim 1, wherein the sleeve portion comprises an inner surface and a first pair of mating features connected to the inner surface of the sleeve portion at or near the first end of the sleeve portion, the first pair of mating features configured to releasably connect two portions of the inner surface of the sleeve portion to each other.

8. The portable storage device of claim 7, wherein the sleeve portion comprises a second pair of mating features connected to the inner surface of the sleeve portion at or near the second end of the sleeve portion, the second pair of mating features configured to releasably connect two portions of the inner surface of the sleeve portion to each other.

9. The portable storage device of claim 1, wherein the sleeve portion comprises a first side extending between first and second ends of the sleeve portion and a second side opposite the first side and extending between the first and second ends of the sleeve portion, and wherein the first strap is connected to the first side of the sleeve portion and the second strap is connected to the second side of the sleeve portion.

10. The portable storage device of claim 1, wherein the first strap has an adjustable length.

11. A cable management device comprising:
a first sleeve section having a first end, a second end, a first edge extending between the first end and the second end, and a second edge extending between the first end and the second end;
a second sleeve section having a first end, a second end, a first edge extending between the first end and the second end, and a second edge extending between the first end and the second end;
a first strap having a first end and a second end, the first end of the first strap connected to the first end of the first sleeve section; and
a second strap having a first end and a second end, the first end of the first strap connected to the second end of the second sleeve section;
wherein at least a portion of the first edge of the first sleeve section is connected to at least a portion of the first edge of the second sleeve section via a first zipper; and
wherein at least a portion of the second edge of the first sleeve section is connected to at least a portion of the second edge of the second sleeve section via a second zipper.

12. The cable management device of claim 11, wherein the first zipper unzips in a direction toward the second end of the first sleeve section with respect to the first end of the first sleeve section, and wherein the second zipper unzips in a direction toward the first end of the first sleeve section with respect to the second end of the first sleeve section.

13. The cable management device of claim 11, wherein the first zipper is configured to remain connected to both the first and second sleeve sections when the first zipper is fully unzipped.

14. The cable management device of claim 13, wherein the second zipper is configured to remain connected to both the first and second sleeve section when the first zipper is fully unzipped.

15. The cable management device of claim 11, wherein the second strap has an adjustable length.

16. The cable management device of claim 11, wherein the second strap is longer than the first strap.

* * * * *